US012105433B2

(12) United States Patent
Feler et al.

(10) Patent No.: US 12,105,433 B2
(45) Date of Patent: Oct. 1, 2024

(54) IMAGING OVERLAY TARGETS USING MOIRÉ ELEMENTS AND ROTATIONAL SYMMETRY ARRANGEMENTS

(71) Applicant: KLA Corporation, Milpitas, CA (US)

(72) Inventors: Yoel Feler, Haifa (IL); Mark Ghinovker, Yoqneam Ilit (IL); Diana Shaphirov, Yoqneam Illit (IL); Evgeni Gurevich, Yokneam Illit (IL); Vladimir Levinski, Nazareth Ilit (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 17/675,912

(22) Filed: Feb. 18, 2022

(65) Prior Publication Data

US 2022/0171297 A1 Jun. 2, 2022
US 2024/0210841 A9 Jun. 27, 2024

Related U.S. Application Data

(63) Continuation of application No. 16/743,124, filed on Jan. 15, 2020, now Pat. No. 11,256,177.
(Continued)

(51) Int. Cl.
*G03F 7/00* (2006.01)
(52) U.S. Cl.
CPC ................. *G03F 7/70633* (2013.01)
(58) Field of Classification Search
CPC ........... G03F 7/70633; G03F 7/706851; G03F 7/70683; G03F 7/706849; G03F 7/70483
See application file for complete search history.

(56) References Cited

U.S. PATENT DOCUMENTS 4,947,413 A 8/1990 Jewell et al.
5,216,257 A 6/1993 Brueck et al.
(Continued)

FOREIGN PATENT DOCUMENTS

CN 101464638 A 6/2009
CN 105849885 A 8/2016
(Continued)

OTHER PUBLICATIONS

Di, Chebgliang et al., "Moire-Based Absolute Interferometry With Large Measurement Range in Wafer-Mask Alignment", IEEE Photonics Technology letters, vol. 27, No. 4, Feb. 15, 2015, pp. 1041-1135.
(Continued)

*Primary Examiner* — Steven H Whitesell
(74) *Attorney, Agent, or Firm* — Suiter Swantz IP

(57) ABSTRACT

A metrology target may include a first rotationally symmetric working zone with one or more instances of a first pattern and a second rotationally-symmetric working zone with one or more instances of a second pattern, where at least one of the first pattern or the second pattern is a Moiré pattern formed from a first grating structure with a first pitch along a measurement direction on a first sample layer and a second grating structure with a second pitch different than the first pitch along the measurement direction on a second sample layer. Centers of rotational symmetry of the first and second working zones may overlap by design when an overlay error between the first sample layer and the second layer is zero. A difference between the centers of rotational symmetry of the first and second working zones may indicate an overlay error between the first and second sample layers.

6 Claims, 21 Drawing Sheets

Related U.S. Application Data

(60) Provisional application No. 62/898,980, filed on Sep. 11, 2019, provisional application No. 62/954,256, filed on Dec. 27, 2019.

(56) References Cited

U.S. PATENT DOCUMENTS

| | | | |
|---|---|---|---|
| 5,414,514 | A | 5/1995 | Smith et al. |
| 5,808,731 | A | 9/1998 | Kirk |
| 5,895,735 | A | 4/1999 | Yoon |
| 5,914,204 | A | 6/1999 | Lee |
| 6,275,621 | B1 | 8/2001 | Terry |
| 6,921,916 | B2 | 7/2005 | Adel et al. |
| 6,958,819 | B1 | 10/2005 | Heaton et al. |
| 7,068,833 | B1 | 6/2006 | Ghinovker et al. |
| 7,177,457 | B2 | 2/2007 | Adel et al. |
| 7,247,843 | B1 | 7/2007 | Moon |
| 7,349,105 | B2 | 3/2008 | Weiss |
| 7,440,105 | B2 | 10/2008 | Adel et al. |
| 7,541,201 | B2 | 6/2009 | Ghinovker |
| 7,602,491 | B2 | 10/2009 | Kandel et al. |
| 9,123,649 | B1 | 9/2015 | Manassen et al. |
| 9,864,209 | B2 | 1/2018 | Levinski et al. |
| 10,488,768 | B2 | 11/2019 | Auer et al. |
| 10,585,357 | B2 | 3/2020 | Schaar et al. |
| 10,705,435 | B2 | 7/2020 | Yang et al. |
| 11,209,737 | B1 | 12/2021 | Stoschus et al. |
| 11,614,692 | B2 | 3/2023 | Levinski et al. |
| 2001/0021477 | A1 | 9/2001 | Dirksen et al. |
| 2002/0080364 | A1 | 6/2002 | Monshouwer et al. |
| 2004/0169861 | A1 | 9/2004 | Mieher et al. |
| 2005/0195398 | A1 | 9/2005 | Adel et al. |
| 2006/0044568 | A1 | 3/2006 | Weiss |
| 2007/0077503 | A1 | 4/2007 | Yoo |
| 2007/0234786 | A1 | 10/2007 | Moon |
| 2007/0242272 | A1 | 10/2007 | Suehira et al. |
| 2007/0279630 | A1* | 12/2007 | Kandel ............... G03F 7/70633 356/401 |
| 2008/0266561 | A1* | 10/2008 | Kandel ............... G03F 7/70633 356/399 |
| 2009/0042108 | A1 | 2/2009 | Yasuzato |
| 2010/0005442 | A1 | 1/2010 | Ghinovker et al. |
| 2011/0122496 | A1 | 5/2011 | Schaar et al. |
| 2013/0193602 | A1 | 8/2013 | Suzuki et al. |
| 2013/0208279 | A1 | 8/2013 | Smith |
| 2013/0252429 | A1 | 9/2013 | Okamoto et al. |
| 2014/0065736 | A1 | 3/2014 | Amir et al. |
| 2014/0240704 | A1 | 8/2014 | Komine et al. |
| 2014/0254916 | A1* | 9/2014 | Lee ..................... H04N 23/11 382/145 |
| 2015/0235880 | A1 | 8/2015 | Inada et al. |
| 2016/0300767 | A1 | 10/2016 | Ko et al. |
| 2017/0146338 | A1 | 5/2017 | Allen |
| 2017/0307367 | A1 | 10/2017 | Yaegashi et al. |
| 2018/0024054 | A1 | 1/2018 | Moon et al. |
| 2018/0188663 | A1 | 7/2018 | Levinski et al. |
| 2019/0033726 | A1 | 1/2019 | Adam et al. |
| 2019/0049373 | A1 | 2/2019 | Levinski |
| 2019/0219930 | A1 | 7/2019 | Yang et al. |
| 2019/0285996 | A1 | 9/2019 | Shibayama et al. |
| 2020/0373182 | A1 | 11/2020 | Ghinovker |
| 2021/0233821 | A1 | 7/2021 | Feler et al. |

FOREIGN PATENT DOCUMENTS

| | | | | |
|---|---|---|---|---|
| EP | 1400855 | A2 * | 3/2004 | ......... G01N 21/4788 |
| JP | 2001093820 | A | 4/2001 | |
| JP | 2002134394 | A | 5/2002 | |
| JP | 2007140460 | A | 6/2007 | |
| JP | 2007170888 | A | 7/2007 | |
| JP | 2010267682 | A | 11/2010 | |
| JP | 2011243664 | A | 12/2011 | |
| JP | 2012253325 | A | 12/2012 | |
| JP | 2013074258 | A | 4/2013 | |
| JP | 2013254780 | A | 12/2013 | |
| JP | 2015154008 | A | 8/2015 | |
| WO | 2018128641 | A1 | 7/2018 | |
| WO | 2019139685 | A1 | 7/2019 | |
| WO | 2020117361 | A1 | 6/2020 | |
| WO | 2020197950 | A1 | 10/2020 | |
| WO | 2020205601 | A1 | 10/2020 | |

OTHER PUBLICATIONS

Fesperman Jr., Ronnie Rex, "Multiscale Alignment and Positioning System" (Doctoral dissertion). Retrieved from ProQuest Information and Learning Company (UMI Microform 3264369).

International Search Report and Written Opinion dated Dec. 18, 2020 for PCT/US2020/049299, 15 pages.

J. Zhu, et al, "Adjustment Strategy for Inclination Moiré Fringes in Lithography by Spatial Frequency Decomposition," in IEEE Photonics Technology Letters, vol. 27, No. 4, pp. 395-398, 15 Feb. 15, 2015, doi: 10.1109/LPT.2014.2370072.

Kikuchi, Eri et al., "Principle and observation of fluorescence moire fringes for alignment in print and imprint methods", J.Vac. Sci. Technol.B 35, 06G303 (2017); https://doi.org/10.1116/1.4990844, Published online: Sep. 26, 2017, 9 pages.

Li, Nianhua et al., Sub-20-nm Alignment in Nanoimprint Lithography Using Moire Fring, Nano Letters 2006, vol. 6, No. 11, p. 2626-2629, NanoStructure Laboratory, Department of Electrical Engineering, Princeton University, Princeton, New Jersey 08544.

Moon, Euclid E., "Immunity to signal degradation by overlayers using a novel spatial-phase-matching alignment system", J. Vac. Sci. Technol. B 13(6), Nov./Dec. 1995, 0734-211X/95/13(6)/2648/5/$6.00, pp. 2648-2652.

Wikipedia: https://en.wikipedia.org/wiki/Moir%C3%A9_pattern, Downloaded Mar. 2, 2021, 15 pages.

Wu, Wei et al., "Nanoimprint Lithography with ≤60 nm Overlay Precision", HP Laboratories, HPL-2012-6, 18 pages.

Zhou, Shaolin et al., "Fourier-based analysis of moire fringe patterns of superposed gratings in alignment of nanolithography", May 26, 2008/vol. 16, No. 11/ Optics Express, pp. 7869-7880.

Zhu, Jiangping et al., "Four-quadrant gratings moire fringe alignment measurement in proximity lithography", Feb. 11, 2013/ vol. 21, No. 3/ Optics Express, pp. 3463-3473.

Chinese Patent Office, Office Action received in CN Application No. 202080061816.9, Feb. 7, 2024, 14 pages (including translation).

Chinese Patent Office, Office Action received in CN Application No. 202080061816.9, Feb. 7, 2024, 4 pages (official translation).

* cited by examiner

IMAGING OVERLAY TARGETS USING MOIRÉ ELEMENTS AND ROTATIONAL SYMMETRY ARRANGEMENTS

CROSS-REFERENCE TO RELATED APPLICATION

The present application constitutes a divisional application of and claims priority to U.S. patent application Ser. No. 16/743,124, filed Jan. 15, 2020, which is a non-provisional application of U.S. Provisional Application Ser. No. 62/898,980, filed Sep. 11, 2019, and U.S. Provisional Application Ser. No. 62/954,256, filed Dec. 27, 2019, whereby the above-listed applications are incorporated herein by reference in their entirety.

TECHNICAL FIELD

The present disclosure relates generally to imaging overlay metrology and, more particularly, to imaging overlay targets with Moiré elements.

BACKGROUND

Shrinking design rules and more demanding specifications for overlay metrology are driving increased demands for the sensitivity and robustness of overlay metrology methods. Overlay metrology is typically performed by fabricating dedicated metrology targets having fabricated features in multiple sample layers of interest. Accordingly, an analysis of a fabricated metrology target may provide a measurement of the overlay error (e.g., relative alignment error) between the sample layers of interest. While a wide variety of overlay metrology target designs have been proposed, there is a continuous need to improve the metrology target designs as well as measurement methods for accurately and efficiently analyzing fabricated metrology targets.

SUMMARY

A metrology target is disclosed in accordance with one or more illustrative embodiments of the present disclosure. In one illustrative embodiment, the target includes a first working zone including one or more instances of a first pattern, where the first working zone is rotationally symmetric. In another illustrative embodiment, the target includes a second working zone including one or more instances of a second pattern, where the second working zone is rotationally symmetric. In another illustrative embodiment, at least one of the first pattern or the second pattern is a Moiré pattern formed from a first grating structure with a first pitch along a measurement direction on a first sample layer and a second grating structure with a second pitch along the measurement direction on a second sample layer, where the second pitch is different than the first pitch. In another illustrative embodiment, a center of rotational symmetry of the first working zone and a center of rotational symmetry of the second working zone overlap when an overlay error between the first sample layer and the second layer is zero. In another illustrative embodiment, a difference between the center of rotational symmetry of the first working zone and the center of rotational symmetry of the second working zone along the measurement direction is indicative of an overlay error between the first sample layer and the second sample layer along the measurement direction.

A metrology system is disclosed in accordance with one or more illustrative embodiments of the present disclosure. In one illustrative embodiment, the system includes a controller configured to be coupled to an imaging system. In another illustrative embodiment, the controller receives an image of a metrology target on the sample. In one illustrative embodiment, the target includes a first working zone including one or more instances of a first pattern, where the first working zone is rotationally symmetric. In another illustrative embodiment, the target includes a second working zone including one or more instances of a second pattern, where the second working zone is rotationally symmetric. In another illustrative embodiment, at least one of the first pattern or the second pattern is a Moiré pattern formed from a first grating structure with a first pitch along a measurement direction on a first sample layer and a second grating structure with a second pitch along the measurement direction on a second sample layer, where the second pitch is different than the first pitch. In another illustrative embodiment, the controller determines a difference between axes of symmetry of the first working zone and the second working zone along the measurement direction in the image. In another illustrative embodiment, the controller calculates an overlay error along the measurement direction associated with the first sample layer and the second sample layer by adjusting the difference between the axes of symmetry of the first working zone and the second working zone along the measurement direction with a Moiré gain based on the pitches of the Moiré pattern.

A metrology target is disclosed in accordance with one or more illustrative embodiments of the present disclosure. In one illustrative embodiment, the target includes a working zone including one or more instances of a Moiré pattern, where the working zone is rotationally symmetric. In another illustrative embodiment, the Moiré pattern includes a grating structure with a first pitch ($p_1$) along a measurement direction on a first sample layer and a grating structure with a second pitch ($p_2$) along the measurement direction on a second sample layer, where the second pitch is different than the first pitch. In another illustrative embodiment, an overlay error along the measurement direction associated with the first sample layer and the second sample layer corresponds to a difference, adjusted by a Moiré gain based on pitch values of the first Moiré pattern, between axes of symmetry of the first working zone imaged with a first optical configuration of an imaging system and a second optical configuration of the imaging system. In another illustrative embodiment, Moiré fringes are detectable with the first optical configuration, wherein at least one of the grating structure with the first pitch or the grating structure with the second pitch are detectable with the second optical configuration.

A metrology system is disclosed in accordance with one or more illustrative embodiments of the present disclosure. In one illustrative embodiment, the system includes an imaging system. In another illustrative embodiment, the imaging system includes an illumination source to generate illumination. In another illustrative embodiment, the imaging system includes one or more illumination optics to direct illumination from the illumination source to a metrology target. In another illustrative embodiment, the target includes a working zone including one or more instances of a Moiré pattern, wherein the working zone is rotationally symmetric. In another illustrative embodiment, the Moiré pattern includes a grating structure with a first pitch ($p_1$) along a measurement direction on a first sample layer and a grating structure with a second pitch ($p_2$) along the measurement direction on a second sample layer, wherein the second pitch is different than the first pitch. In another illustrative embodiment, the imaging system includes a detector to generate an image of the metrology target based on the illumination from the illumination source, where an optical configuration of the imaging system is configurable. In another illustrative embodiment, the optical configuration includes a wavelength of the illumination, a polarization of the illumination incident on the metrology target, an angle of the illumination incident on the metrology target, or a focal position of the metrology target with respect to the detector. In another illustrative embodiment, the system includes a controller configured to be coupled to the imaging system. In another illustrative embodiment, the controller receives a first image of the metrology target on the sample using a first optical configuration. In another illustrative embodiment, the controller determines a first axis of symmetry of the working zone along the measurement direction based on the first image. In another illustrative embodiment, the controller receives a second image of the metrology target on the sample using a second optical configuration different than the first optical configuration. In another illustrative embodiment, the controller determines a second axis of symmetry of the working zone along the measurement direction based on the second image. In another illustrative embodiment, the controller determines an optical overlay measurement based on a difference between the first axis of symmetry and the second axis of symmetry. In another illustrative embodiment, the controller calculates an overlay error along the measurement direction associated with the first sample layer and the second sample layer by adjusting the difference between the axes of symmetry in the first image and the second image adjusted by a Moiré gain based on pitches of the Moiré pattern.

A method for designing a Moiré metrology target is disclosed in accordance with one or more illustrative embodiments of the present disclosure. In one illustrative embodiment, the method includes receiving a design of a metrology target. In another illustrative embodiment, the target includes a working zone including one or more instances of a Moiré pattern including a first grating structure with a first pitch ($p_1$) along a measurement direction on a first sample layer and a second grating structure with a second pitch ($p_2$) along the measurement direction on a second sample layer, where the second pitch is different than the first pitch. In another illustrative embodiment, the method includes receiving an optical configuration of an imaging system for imaging the metrology target. In another illustrative embodiment, the method includes performing a design of experiments to select a set of target design parameters of the metrology target that provides a Moiré fringe pattern meeting selected design criteria when imaged by the imaging system, where the set of target design parameters includes the first pitch and the second pitch.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures.

DETAILED DESCRIPTION

Figure 1:
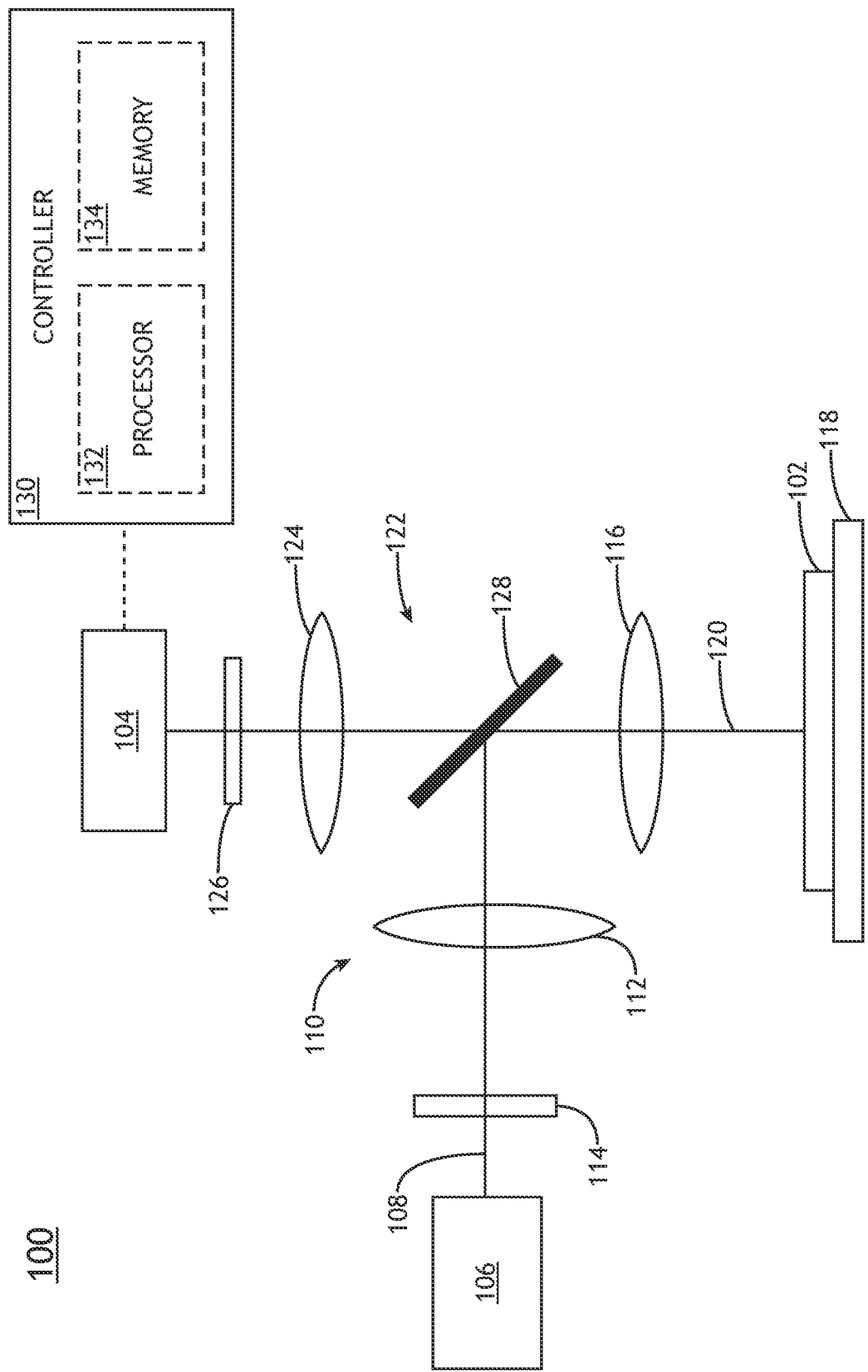
FIG. 1 is a block diagram view of a metrology system, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to overlay metrology targets having Moiré patterns and methods of measuring overlay based on such targets. For example, a Moiré pattern on a metrology target may include a grating-over-grating structure formed from grating structures on different sample layers with different periods. Further, for the purposes of this disclosure, a "grating" or a "grating structure" may describe any periodic structure or series of elements that may include, but is not limited to, line/space patterns. An image of the Moiré pattern will include Moiré fringes at a Moiré pitch, which is associated with spatially-varying overlap between the gratings on the different sample layers. The Moiré pitch is typically a longer pitch than either of the grating structures and is related to the difference between the pitches of the grating structures. For example, the Moiré pitch ($p_M$) may be characterized as:

$$p_M = \frac{p_1 \cdot p_2}{p_1 - p_2} \quad (1)$$

where $p_1$ is the period of a first grating structure on a first layer, and $p_2$ is the period of the second grating structure on the second layer.

It is contemplated herein that metrology targets including Moiré patterns may facilitate sensitive overlay measurements. In particular, a physical shift of one grating with respect to another grating in a Moiré pattern (e.g., an overlay error associated with a relative shift of two sample layers on a sample) along a direction of periodicity will result in a corresponding lateral shift of the Moiré fringes along the measurement direction. Further, the magnitude of the shift of the Moiré fringes is typically greater than the magnitude of the physical shift. In particular, the magnitude of the shift of the Moiré fringes is proportional to the physical shift (e.g., the overlay error) by a conditional Moiré factor, which depends on the frame of reference. Continuing the example above, a shift of the second layer with respect to the first layer will result in a shift of the Moiré fringes from a nominal position (e.g., no overlay error) by a conditional Moiré factor (M) of:

$$M = \frac{p_1}{p_1 - p_2}. \quad (2)$$

However, in the context of the present disclosure, references to "first layer," "second layer," "third layer," or the like are intended merely to distinguish various sample layers and do not indicate a physical ordering of layers on the sample. Accordingly, a "first layer" may be above or below a "second layer" on the sample.

In this regard, an overlay measurement may be performed by measuring a shift of the Moiré fringes along the direction of periodicity of the associated grating structures on a metrology target and adjusting this value by a Moiré gain, which will depend on the particular design of the metrology target and the particular measurements made. For example, it may be desirable to measure a shift of Moiré fringes relative to another structure or another set of Moiré fringes since an absolute measurement of a single Moiré fringe shift may be difficult, impractical, or impossible for some target designs. The use of Moiré patterns in overlay metrology is generally described in U.S. Pat. No. 7,440,105 issued on Oct. 21, 2008, U.S. Pat. No. 7,349,105 issued on Mar. 25, 2008, and U.S. Patent Application No. 2018/0188663 published on Jul. 5, 2018, all of which are incorporated herein in their entirety.

It is further recognized herein that arranging elements of a metrology target in a symmetric configuration may facilitate the determination of relative positions of the elements based on exploitation of the symmetry. For example, an overlay metrology target may be formed such that a center of symmetry of elements on a first sample layer overlaps a center of symmetry of elements on a second sample layer. Accordingly, any difference between the centers of symmetry for elements in the first layer with respect to the second layer in a fabricated metrology target may be attributed to overlay error. The exploitation of symmetry in overlay metrology targets (e.g., Advanced Imaging Metrology (AIM) targets) is described generally in U.S. Pat. No. 7,068,833 issued on Jun. 27, 2006, U.S. Pat. No. 6,921,916 issued on Jul. 26, 2005, and U.S. Pat. No. 7,177,457 issued on Feb. 13, 2007, all of which are incorporated herein by reference in their entirety.

Embodiments of the present disclosure are directed to overlay metrology targets having at least one working zone with one or more Moiré patterns arranged in a symmetric distribution. For example, the Moiré patterns within the working zone may be distributed in a mirror symmetric distribution or a rotationally symmetric distribution (e.g., a 90° rotationally-symmetric distribution, a 180° rotationally-symmetric distribution, or the like). In this regard, advantages of Moiré patterns and advantages of symmetry in metrology targets may be combined and exploited together to facilitate accurate and robust overlay metrology.

It is recognized herein that the impact of a physical overlay error on a working group including one or more instances of a Moiré pattern may be to shift a center of symmetry based on a shift of Moiré fringes as described previously herein. Accordingly, any measurement of overlay based on the center of symmetry must be adjusted based on a Moiré gain factor. It is further recognized herein that the Moiré gain factor may depend on the particular arrangement of elements in an overlay metrology target.

FIG. 1 is a block diagram view of a metrology system 100, in accordance with one or more embodiments of the present disclosure. The metrology system 100 may generate one or more images of a sample 102 on at least one detector 104 using any method known in the art.

In one embodiment, the metrology system 100 includes an illumination source 106 to generate an illumination beam 108. The illumination beam 108 may include one or more selected wavelengths of light including, but not limited to, vacuum ultraviolet radiation (VUV), deep ultraviolet radiation (DUV), ultraviolet (UV) radiation, visible radiation, or infrared (IR) radiation. The illumination source 106 may further generate an illumination beam 108 including any range of selected wavelengths. In another embodiment, the illumination source 106 may include a spectrally-tunable illumination source to generate an illumination beam 108 having a tunable spectrum.

The illumination source 106 may further produce an illumination beam 108 having any temporal profile. For example, the illumination source 106 may produce a continuous illumination beam 108, a pulsed illumination beam 108, or a modulated illumination beam 108. Additionally, the illumination beam 108 may be delivered from the illumination source 106 via free-space propagation or guided light (e.g. an optical fiber, a light pipe, or the like).

In another embodiment, the illumination source 106 directs the illumination beam 108 to a sample 102 via an illumination pathway 110. The illumination pathway 110 may include one or more lenses 112 or additional illumination optical components 114 suitable for modifying and/or conditioning the illumination beam 108. For example, the one or more illumination optical components 114 may include, but are not limited to, one or more polarizers, one or more filters, one or more beam splitters, one or more diffusers, one or more homogenizers, one or more apodizers, one or more beam shapers, or one or more shutters (e.g., mechanical shutters, electro-optical shutters, acousto-optical shutters, or the like). By way of another example, the one or more illumination optical components 114 may include aperture stops to control the angle of illumination on the sample 102 and/or field stops to control the spatial extent of illumination on the sample 102. In one instance, the illumination pathway 110 includes an aperture stop located at a plane conjugate to the back focal plane of the objective lens 116 to provide telecentric illumination of the sample. In another embodiment, the metrology system 100 includes an objective lens 116 to focus the illumination beam 108 onto the sample 102.

In another embodiment, the sample 102 is disposed on a sample stage 118. The sample stage 118 may include any device suitable for positioning the sample 102 within the metrology system 100. For example, the sample stage 118 may include any combination of linear translation stages, rotational stages, tip/tilt stages or the like.

In another embodiment, a detector 104 is configured to capture radiation emanating from the sample 102 (e.g., sample light 120) through a collection pathway 122. For example, the collection pathway 122 may include, but is not required to include, a collection lens (e.g. the objective lens 116 as illustrated in FIG. 1) or one or more additional collection pathway lenses 124. In this regard, a detector 104 may receive radiation reflected or scattered (e.g. via specular reflection, diffuse reflection, and the like) from the sample 102 or generated by the sample 102 (e.g. luminescence associated with absorption of the illumination beam 108, or the like).

The collection pathway 122 may further include any number of collection optical components 126 to direct and/or modify illumination collected by the objective lens 116 including, but not limited to one or more collection pathway lenses 124, one or more filters, one or more polarizers, or one or more beam blocks. Additionally, the collection pathway 122 may include field stops to control the spatial extent of the sample imaged onto the detector 104 or aperture stops to control the angular extent of illumination from the sample used to generate an image on the detector 104. In another embodiment, the collection pathway 122 includes an aperture stop located in a plane conjugate to the back focal plane of the objective lens 116 to provide telecentric imaging of the sample.

The detector 104 may include any type of optical detector known in the art suitable for measuring illumination received from the sample 102. For example, a detector 104 may include a sensor suitable for generating one or more images of a static sample 102 (e.g., in a static mode of operation) such as, but is not limited to, a charge-coupled device (CCD), a complementary metal-oxide-semiconductor (CMOS) sensor, a photomultiplier tube (PMT) array, or an avalanche photodiode (APD) array. Further, the detector 104 may include a multi-tap sensor having two or more taps per pixel including, but not limited to, a multi-tap CMOS sensor. In this regard, charge in a multi-tap pixel may be directed to any selected tap during an exposure window based on one or more drive signals to the pixel. Accordingly, a multi-tap sensor including an array of multi-tap pixels may generate multiple images, each associated with different taps of the associated pixels, during a single readout phase. Further, for the purposes of the present disclosure, a tap of a multi-tap sensor may refer to an output tap connected to the associated pixels. In this regard, reading out each tap of a multi-tap sensor (e.g., in a readout phase) may generate a separate image.

By way of another example, a detector 104 may include a sensor suitable for generating one or more images of a sample 102 in motion (e.g., a scanning mode of operation). For instance, the detector 104 may include a line sensor including a row of pixels. In this regard, the metrology system 100 may generate a continuous image (e.g., a strip image) one row at a time by translating the sample 102 in a scan direction perpendicular to the pixel row through a measurement field of view and continuously clocking the line sensor during a continuous exposure window.

In another instance, the detector 104 may include a TDI sensor including multiple pixel rows and a readout row. The TDI sensor may operate in a similar manner as the line sensor, except that clocking signals may successively move charge from one pixel row to the next until the charge reaches the readout row, where a row of the image is generated. By synchronizing the charge transfer (e.g., based on the clocking signals) to the motion of the sample along the scan direction, charge may continue to build up across the pixel rows to provide a relatively higher signal to noise ratio compared to the line sensor.

In another embodiment, a detector 104 may include a spectroscopic detector suitable for identifying wavelengths of radiation emanating from the sample 102. In another embodiment, the metrology system 100 may include multiple detectors 104 (e.g. associated with multiple beam paths generated by one or more beamsplitters to facilitate multiple metrology measurements by the metrology system 100. For example, the metrology system 100 may include one or more detectors 104 suitable for static mode imaging and one or more detectors 104 suitable for scanning mode imaging. In another embodiment, the metrology system 100 may include one or more detectors 104 suitable for both static and scanning imaging modes.

In one embodiment, as illustrated in FIG. 1, the metrology system 100 includes a beamsplitter 128 oriented such that the objective lens 116 may simultaneously direct the illumination beam 108 to the sample 102 and collect radiation emanating from the sample 102.

In another embodiment, the angle of incidence of the illumination beam 108 on the sample 102 is adjustable. For example, the path of the illumination beam 108 through the beamsplitter 128 and the objective lens 116 may be adjusted to control the angle of incidence of the illumination beam 108 on the sample 102. In this regard, the illumination beam 108 may have a nominal path through the beamsplitter 128 and the objective lens 116 such that the illumination beam 108 has a normal incidence angle on the sample 102. By way of another example, the angle of incidence of the illumination beam 108 on the sample 102 may be controlled by modifying the position and/or angle of the illumination beam 108 on the beamsplitter 128 (e.g. by rotatable mirrors, a spatial light modulator, a free-form illumination source, or the like). In another embodiment, the illumination source 106 directs the one or more illumination beam 108 to the sample 102 at an angle (e.g. a glancing angle, a 45-degree angle, or the like).

In another embodiment, the metrology system 100 includes a controller 130. In another embodiment, the controller 130 includes one or more processors 132 configured to execute program instructions maintained on a memory medium 134. In this regard, the one or more processors 132 of controller 130 may execute any of the various process steps described throughout the present disclosure. Further, the controller 130 may be configured to receive data including, but not limited to, images of the sample 102 from the detector 104).

The one or more processors 132 of a controller 130 may include any processing element known in the art. In this sense, the one or more processors 132 may include any microprocessor-type device configured to execute algorithms and/or instructions. In one embodiment, the one or more processors 132 may consist of a desktop computer, mainframe computer system, workstation, image computer, parallel processor, or any other computer system (e.g., networked computer) configured to execute a program configured to operate the metrology system 100, as described throughout the present disclosure. It is further recognized that the term "processor" may be broadly defined to encompass any device having one or more processing elements, which execute program instructions from a non-transitory memory medium 134. Further, the steps described throughout the present disclosure may be carried out by a single controller 130 or, alternatively, multiple controllers. Additionally, the controller 130 may include one or more controllers housed in a common housing or within multiple housings. In this way, any controller or combination of controllers may be separately packaged as a module suitable for integration into metrology system 100. Further, the controller 130 may analyze data received from the detector 104 and feed the data to additional components within the metrology system 100 or external to the metrology system 100.

The memory medium 134 may include any storage medium known in the art suitable for storing program instructions executable by the associated one or more processors 132. For example, the memory medium 134 may include a non-transitory memory medium. By way of another example, the memory medium 134 may include, but is not limited to, a read-only memory, a random access memory, a magnetic or optical memory device (e.g., disk), a magnetic tape, a solid state drive and the like. It is further noted that memory medium 134 may be housed in a common controller housing with the one or more processors 132. In one embodiment, the memory medium 134 may be located remotely with respect to the physical location of the one or more processors 132 and controller 130. For instance, the one or more processors 132 of controller 130 may access a remote memory (e.g., server), accessible through a network (e.g., internet, intranet and the like). Therefore, the above description should not be interpreted as a limitation on the present invention but merely an illustration.

In another embodiment, the controller 130 is communicatively coupled to one or more elements of the metrology system 100. In this regard, the controller 130 may transmit and/or receive data from any component of the metrology system 100. Further, the controller 130 may direct or otherwise control any component of the metrology system 100 by generating one or more drive signals for the associated components. For example, the controller 130 may be communicatively coupled to the detector 104 to receive one or more images from the detector 104.

Further, the controller 130 may provide one or more drive signals to the detector 104 to carry out any of the detection techniques described herein. By way of another example, the controller 130 may be communicatively coupled to any combination of components to control the optical configuration associated with an image including, but not limited to, the illumination source 106, the illumination optical components 114, the collection optical components 126, the detector 104, or the like.

Referring now to FIGS. 2A through 14, metrology of overlay targets having Moiré patterns based on grating-over-grating structures in one or more rotationally-symmetric working zones is described in greater detail. FIGS. 2A through 6 illustrate overlay using metrology targets having Moiré patterns in two working zones. FIGS. 7 through 10 illustrate overlay using metrology targets having Moiré patterns in one working zone and single-layer structures (e.g., not a grating over grating structure) in a second working zone. FIGS. 11A through 12 illustrate overlay using metrology targets with three or more layers having Moiré patterns in two working zones, where one layer serves as a reference layer. FIGS. 13A through 14 illustrate overlay using a single working zone with one or more Moiré patterns, where overlay may be determined based on imaging with different optical conditions.

Figure 2A:
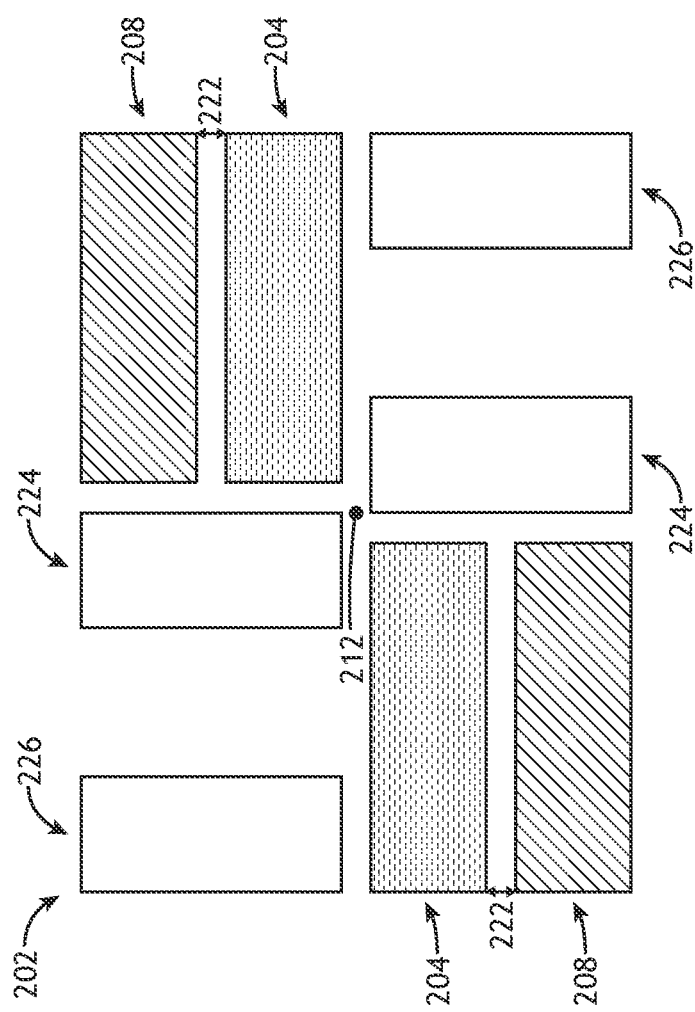
FIG. 2A is a top block diagram view of a metrology target having Moiré patterns based on grating-over-grating structures in multiple rotationally-symmetric working zones, in accordance with one or more embodiments of the present disclosure.
Figure 2B:
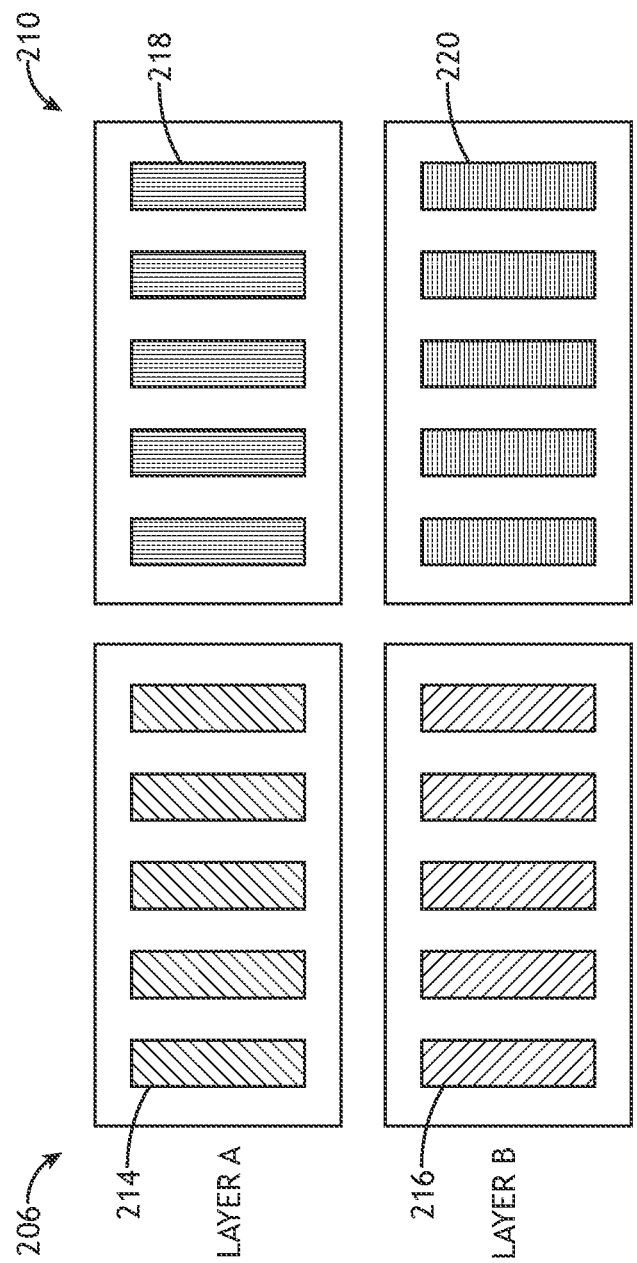
FIG. 2B is a conceptual view of multi-layer grating structures in the Moiré patterns of FIG. 2A, in accordance with one or more embodiments of the present disclosure.

FIG. 2A is a top block diagram view of a metrology target 202 having Moiré patterns based on grating-over-grating structures in multiple rotationally-symmetric working zones, in accordance with one or more embodiments of the present disclosure. FIG. 2B is a conceptual view of multi-layer grating structures in the Moiré patterns of FIG. 2A, in accordance with one or more embodiments of the present disclosure.

In one embodiment, a metrology target 202 includes a first working zone 204 formed from two instances of a first Moiré pattern 206 arranged such that the first working zone 204 is rotationally symmetric. In another embodiment, the metrology target 202 includes a second working zone 208 formed from two instances of a second Moiré pattern 210 arranged such that the second working zone 208 is rotationally symmetric. In the context of the present disclosure, a working zone is a group of features that are intended to be analyzed together. For example, an overlay measurement may be performed by comparing characteristics of one working zone to another.

In a general sense, the centers of rotational symmetry of various working zones in a metrology target 202 may be independent. However, it may be desirable to design the metrology target 202 such that the centers of symmetry of some or all of the working zones coincide (within a selected tolerance) when there is no overlay error. This target design may minimize errors that may arise due to rotational misalignment between a measurement system (e.g., metrology system 100) and the wafer axes. In one embodiment, working zones of the same direction (e.g., X direction overlay measurements) have the same centers of symmetry. Further, centers of symmetry of working zones associated with overlay measurements along different directions may, but are not required to, coincide.

As illustrated in FIG. 2A, which depicts a situation with no overlay error, the first working zone 204 and the second working zone 208 are symmetric to 180° rotation about a center of symmetry 212.

The metrology target 202 in FIG. 2A may have similar rotational symmetry characteristics as an Advanced Imaging Metrology (AIM) target, which is generally described in U.S. Pat. No. 7,068,833 issued on Jun. 27, 2006, U.S. Pat. No. 6,921,916 issued on Jul. 26, 2005, and U.S. Pat. No. 7,177,457 issued on Feb. 13, 2007. However, whereas each working zone in a typical AIM target includes features in a single layer, at least one working zone of the metrology target 202 (e.g., the first working zone 204 and second working zone 208) includes a Moiré pattern formed from grating structures in multiple layers of interest. As illustrated in FIG. 2B, the first Moiré pattern 206 is formed from a first grating structure 214 having a pitch Q in a first layer (layer A) and a second grating structure 216 having a pitch P in a second layer (layer B), where P≠Q. Further, the second Moiré pattern 210 is formed from a third grating structure 218 having a pitch T in the first layer (layer A) and a fourth grating structure 220 having a pitch S in the second layer (layer B), where S≠T. In a general sense, the values of P, Q, S, and T may be independently varied such that FIGS. 2A and 2B represent a generic Moiré AIM target.

As described previously herein with respect to equations (1) and (2), the first working zone 204 will then have a Moiré pitch ($p_{M1}$) of $$p_{M1} = \frac{QP}{Q-P} \qquad (3)$$

and the second working zone 208 will have a Moiré pitch ($p_{M2}$) of $$p_{M2} = \frac{ST}{S-T}. \qquad (4)$$

The first working zone 204 will then have a conditional Moiré factor ($M_1$) of $$M_1 = \frac{P}{P-Q} \qquad (5)$$

associated with a misalignment of layer A with respect to layer B, and the second working zone 208 will have a conditional Moiré factor ($M_2$) of $$M_2 = \frac{S}{S-T}. \qquad (6)$$

associated with a shift of layer A with respect to layer B. Similarly, a shift of layer B with respect to layer A would provide $$M_1 = \frac{Q}{Q-P} \text{ and } M_2 = \frac{T}{T-S}.$$

In one embodiment, the first Moiré pattern 206 and/or the second Moiré pattern 210 include a grating-over-grating structure in which the respective gratings are fully overlapping. For example, the first grating structure 214 and the second grating structure 216 of the first Moiré pattern 206 may be fully overlapping on the sample 102. Similarly, the third grating structure 218 and the fourth grating structure 220 of the second Moiré pattern 210 may be fully overlapping on the sample 102. In this regard, the size of the metrology target 202 may be minimized to efficiently utilize space on the sample 102.

It is contemplated herein that a metrology target 202 including adjacent Moiré patterns may be susceptible to cross-talk. Further, the severity of cross-talk may depend on several factors including, but not limited to, the stack thicknesses, material properties, grating design, or conditions of a measurement system (e.g., metrology system 100). In some embodiments, the metrology target 202 includes exclusion zones between working zones, or Moiré patterns associated with different working zones, to reduce cross-talk within a selected tolerance. For example, instances of the first Moiré pattern 206 and the second Moiré pattern 210 may be separated by an exclusion zone 222 sufficiently large enough to mitigate cross-talk between the corresponding Moiré fringes within a specified tolerance. In some embodiments, the exclusion zone 222 is in the range of 0.25 to 0.5 microns or greater.

The exclusion zone 222 may be empty or may be filled with sub-resolution assist features, which may be required by some design rules. In one embodiment, the exclusion zone 222 is filled with sub-resolution assist features oriented orthogonal to the measurement direction (the X direction here). In a general sense, as long as each working zone is rotationally symmetric, elements in each working zone (including Moiré patterns) may be placed in any 2D distribution suitable for mitigating cross-talk to within a selected tolerance.

Further, although FIG. 2A depicts working zones associated with measurements along a single direction (e.g., the X direction), the metrology target 202 targets and methods for measurement along additional directions (e.g., the Y direction) are within the spirit and scope of the present disclosure. In one embodiment, the metrology target 202 includes a third working zone 224 and a fourth working zone 226 suitable for measurement along the Y direction. Further, the features in the third working zone 224 and/or the fourth working zone 226 may have any features suitable for overlay measurement and may, but are not required to, include one or more Moiré patterns. In another embodiment, though not shown, the metrology target 202 includes a working zone having a 2D Moiré pattern including periodic features in multiple directions (e.g., the X and Y directions). In this regard, the 2D Moiré pattern may exhibit Moiré fringes simultaneously along the multiple dimensions and may thus be suitable for simultaneous overlay measurements in multiple directions.

Figure 2C:
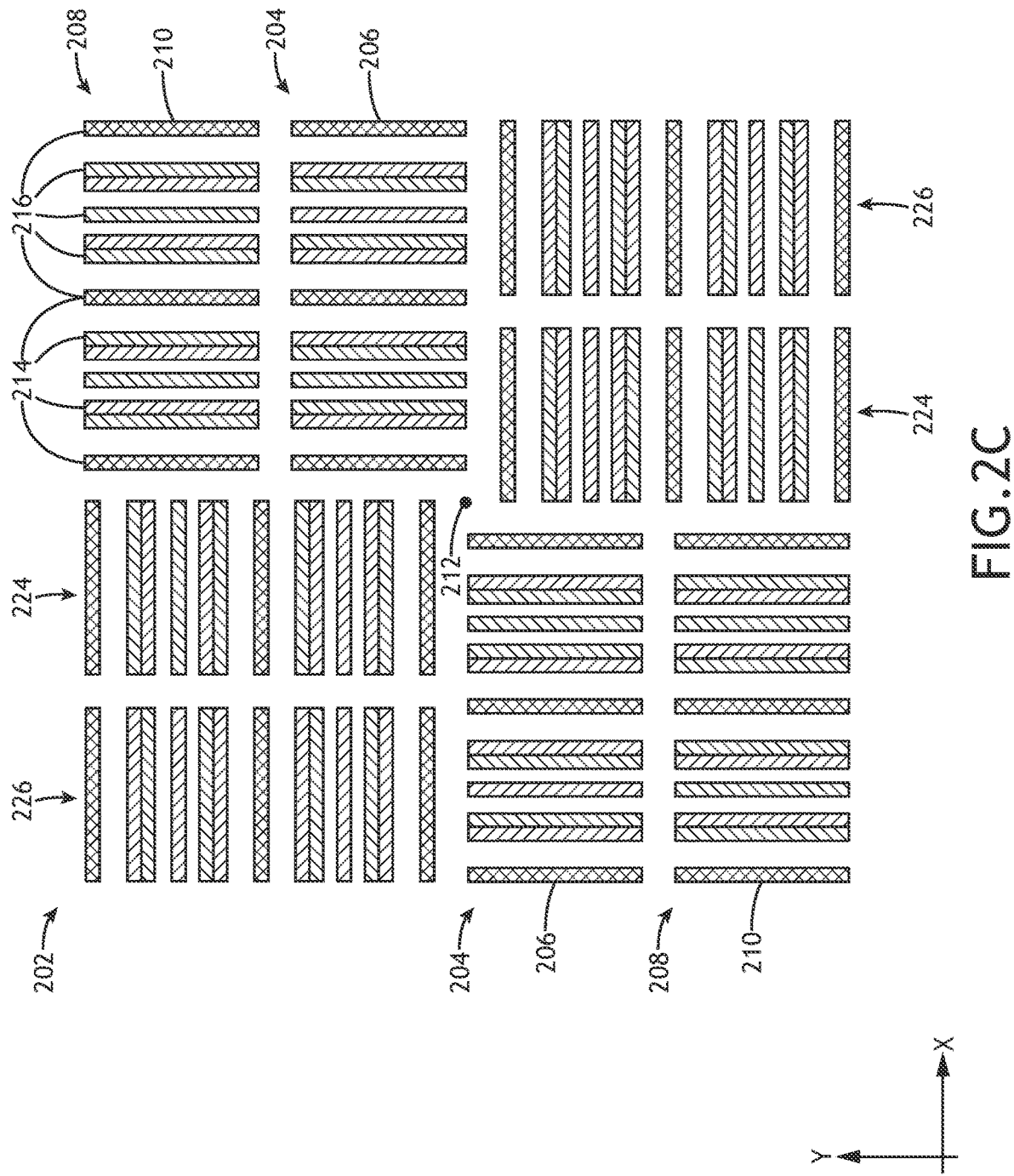
FIG. 2C is a top view of a metrology target based on FIGS. 2A and 2B for measurement along two orthogonal directions, in accordance with one or more embodiments of the present disclosure.

FIG. 2C is a top view of a metrology target 202 based on FIGS. 2A and 2B for measurement along two orthogonal directions, in accordance with one or more embodiments of the present disclosure. In particular, the metrology target 202 illustrated in FIG. 2C represents an example in which P=T and Q=S. Further, FIG. 2C illustrates a situation with no overlay error in either the X-direction or the Y-direction. In this regard, the axes of symmetry of the first working zone 204 and the second working zone 208 overlap along both the X and Y directions (e.g., the axes of symmetry of the first working zone 204 and the second working zone 208 overlap).

However, it is to be understood that FIG. 2C and the associated descriptions are provided solely for illustrative purposes and should not be interpreted as limiting.

In one embodiment, the metrology target 202 includes a first working zone 204 with two instances of a first Moiré pattern 206 for measurement along the X direction, a second working zone 208 including two instances of a second Moiré pattern 210, a third working zone 224 with two instances of the first Moiré pattern 206 for measurement along the Y direction, and a fourth working zone 226 with two instances of the second Moiré pattern 210 for measurement along the vertical direction. In this regard, the third working zone 224 and the fourth working zone 226 are rotated versions of the first working zone 204 and the second working zone 208, respectively.

Figure 3A:
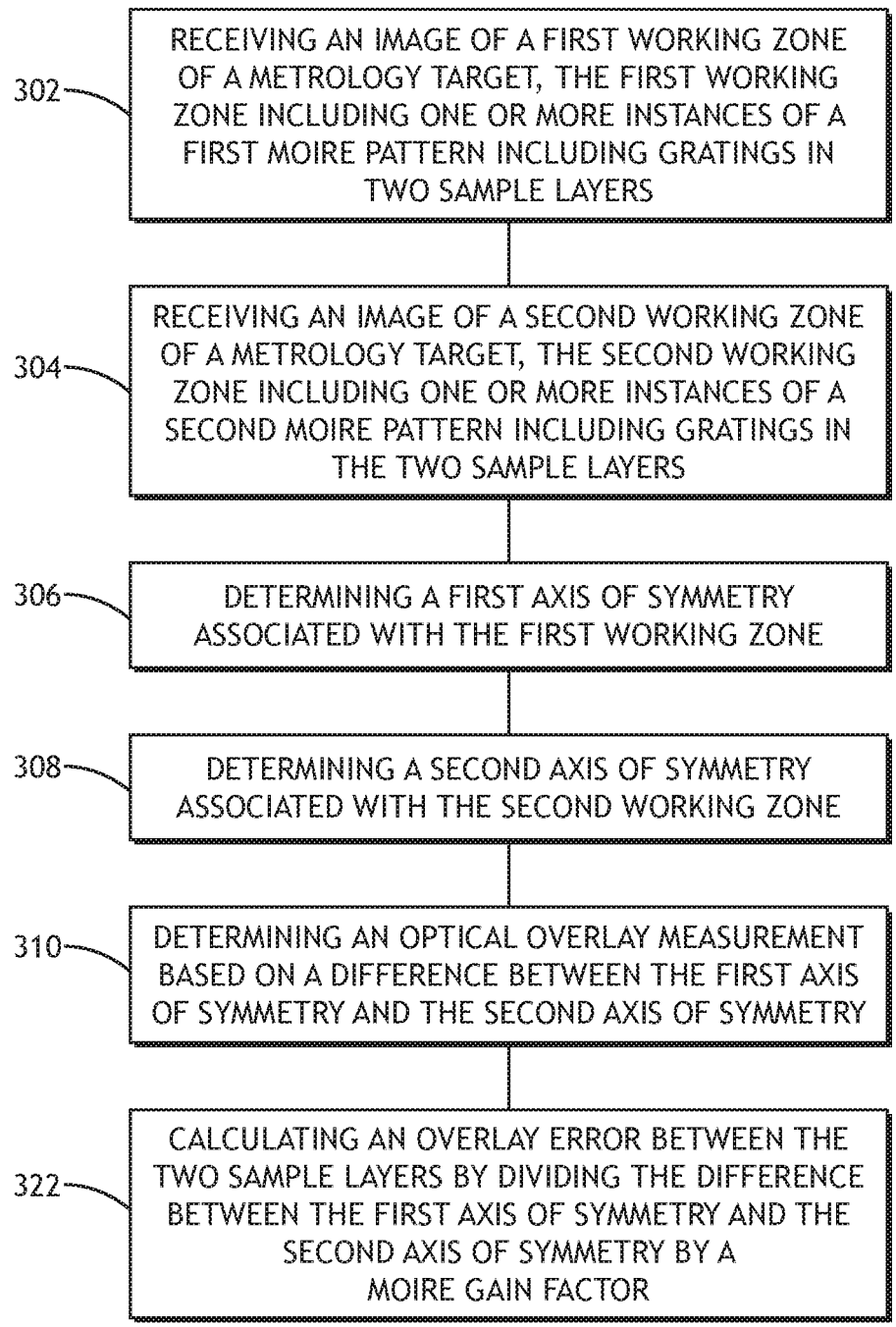
FIG. 3A is a flow diagram illustrating steps performed in a method for measuring overlay, in accordance with one or more embodiments of the present disclosure.

FIG. 3A is a flow diagram illustrating steps performed in a method 300 for measuring overlay, in accordance with one or more embodiments of the present disclosure. For example, the method 300 may be applied to measure overlay based on a metrology target such as, but not limited to, metrology target 202 illustrated in FIGS. 2A-2C. Applicant notes that the embodiments and enabling technologies described previously herein in the context of the metrology system 100 should be interpreted to extend to the method 300. It is further noted, however, that the method 300 is not limited to the architecture of the metrology system 100. Further, the method 300 may be applied to measure overlay along a one or more measurement directions.

In one embodiment, the method 300 includes a step 302 of receiving an image of a first working zone of a metrology target, the first working zone including one or more instances of a first Moiré pattern including gratings in two sample layers. In another embodiment, the method 300 includes a step 304 of receiving an image of a second working zone of a metrology target, the second working zone including one or more instances of a second Moiré pattern including gratings in the two sample layers.

The images of the first Moiré pattern 206 and the second Moiré pattern 210 may be associated with separate images or a single, common image. In one embodiment, an image of the entire metrology target 202 is obtained (e.g., with the metrology system 100) such that the first working zone 204 and the second working zone 208 may be analyzed based on the same image. In another embodiment, separate images of the metrology target 202 (or portions thereof) are generated for the analysis of the first working zone 204 and the second working zone 208. In this regard, images may be generated using different imaging conditions (e.g., different wavelengths of illumination, angles of illumination incidence, polarization, focus, or the like).

In another embodiment, the method 300 includes a step 306 of determining a first axis of symmetry orthogonal to a measurement direction associated with the first working zone. In another embodiment, the method 300 includes a step 308 of determining a second axis of symmetry orthogonal to the measurement direction associated with the second working zone. In another embodiment, the method 300 includes a step 310 of measuring a difference between the first axis of symmetry and the second axis of symmetry. Further, a center of symmetry 212 of one or more working zones may be found by determining axes of symmetry orthogonal to different directions (e.g., orthogonal directions) and finding an intersection point.

The axes of symmetry of the first working zone 204 and the second working zone 208 may be determined using any technique known in the art in step 302 or step 304. For example, techniques suitable for the measurement of the centers of symmetry of typical AIM targets without Moiré patterns may be used.

Figure 3B:
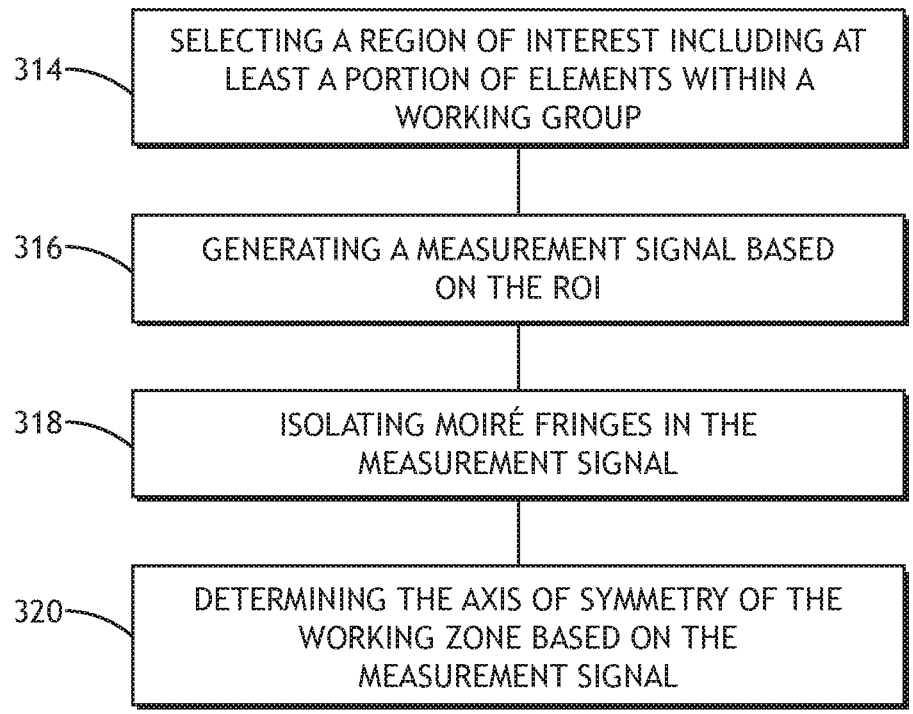
FIG. 3B is a flow diagram illustrating a method for determining an axis of symmetry of a working group.
Figure 4:
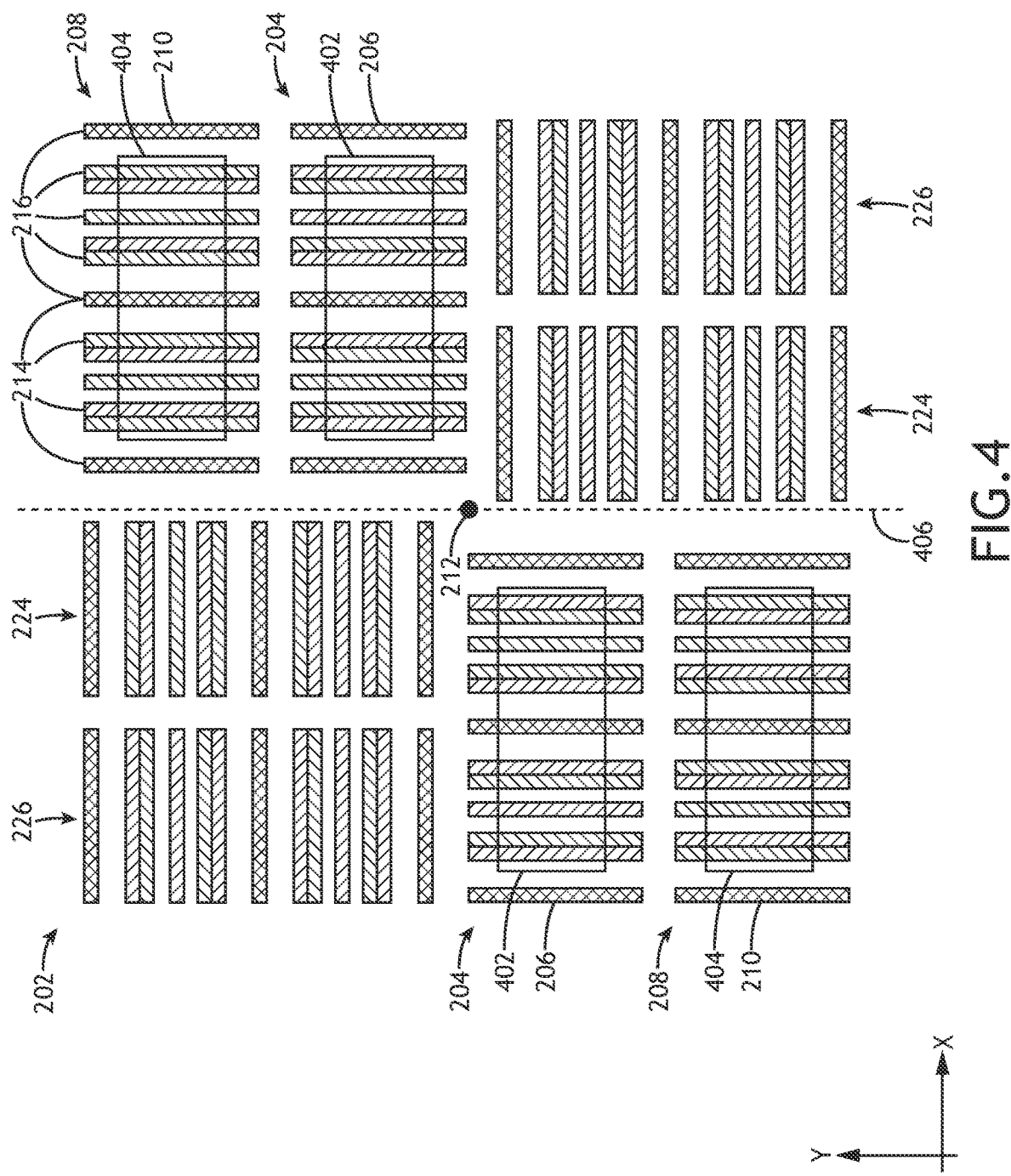
FIG. 4 is a top view of the metrology target of FIG. 2C with additional markings illustrating the application of the method, in accordance with one or more embodiments of the present disclosure.

FIG. 3B is a flow diagram illustrating a method 312 for determining an axis of symmetry of a working group orthogonal to a measurement direction. In this regard, the method 312 may be associated with step 306 and/or step 308. FIG. 4 is a top view of the metrology target 202 of FIG. 2C with additional markings illustrating the application of the method 312, in accordance with one or more embodiments of the present disclosure.

In one embodiment, a step 314 includes selecting a region of interest (ROI) including at least a portion of elements within a working group. For example, the solid boxes in FIG. 4 represent an ROI 402 selecting portions of the first Moiré pattern 206 in the first working zone 204 and the dashed boxes represent an ROI 404 selecting portions of the second Moiré pattern 210 in the second working zone 208.

In another embodiment, a step 316 includes generating a measurement signal based on the ROI. For example, each value of a measurement signal along the measurement direction may include average (or cumulative) intensity values in the ROI along an orthogonal direction.

It is contemplated herein that the Moiré fringes associated with a Moiré pattern (e.g., the first Moiré pattern 206 or the second Moiré pattern 210) may have a relatively low contrast with respect to the grating structures forming the Moiré pattern that may be visible in an image of the metrology target 202. In another embodiment, a step 318 includes isolating Moiré fringes in the measurement signal. For example, the step 318 may include one or more orders of Moiré fringes (e.g., $1^{st}$-order, $2^{nd}$-order, or the like). Isolating the Moiré fringes may decrease noise and increase the accuracy and/or sensitivity of the determination of the axes of symmetry in step 306 and/or 308 and may thus improve the accuracy and/or robustness of the determination of the axis of symmetry.

The Moiré fringes may be isolated in step 318 using any technique known in the art. In one embodiment, the measurement signal is filtered to isolate the Moiré fringes. For example, the spatial frequency content of the measurement signal may be analyzed using a 1D or 2D Fourier filtering or other frequency-based decomposition technique (e.g., decomposition of the measurement signal into sin and/or cos signals). Further, a frequency-selective filter may be used to isolate the spatial frequency of the Moiré fringes (e.g., $1^{st}$-order Moiré fringes, $2^{nd}$-order Moiré fringes, or the like).

Referring again to FIG. 3A, in another embodiment, the method 312 may include a step 320 of determining an axis of symmetry 406 of the working zone orthogonal to the measurement direction based on the measurement signal. An axis of symmetry 406 of a working zone orthogonal to the measurement direction may be determined using any technique known in the art (e.g., in step 306 or step 308 of method 300 or step 320 of method 312). In one embodiment, a portion of the image of the first Moiré pattern 206 (e.g., the ROI of step 314) is correlated with a symmetric version of itself to determine the axis of symmetry. For example, an axis of symmetry 406 of the first working zone 204 may be determined by generating a copy of the portion of the image including the first working zone 204, rotating the image copy by the relevant rotational symmetry of the metrology target 202 (e.g., 90°, 180°, or the like) and performing a correlation between the original image and the image copy at various locations as a function of position along the measurement direction. In this regard, the location along the measurement direction providing the highest correlation between the original image and the rotated version may correspond to the axis of symmetry 406 of the first working zone 204. By way of another example, in the case of a working zone having reflection symmetry (or mirror symmetry), the axis of symmetry 406 of a working zone may be determined by correlating a reflected copy of the working zone with itself.

As described previously herein, the steps associated with the method 312 may be applied to determine the axis of symmetry 406 of any number of working zones. For example, both step 306 and step 308 may include the application of the method 312.

It is to be understood, however, that the method 312 for determining an axis of symmetry 406 of a working zone along a measurement direction is provided solely for illustrative purposes and should not be interpreted as limiting. Rather, an axis of symmetry 406 may be determined using any technique known in the art. In one embodiment, an axis of symmetry 406 of a working group along a measurement direction may be applied by first determining regions of interest (e.g., ROI 402 in step 314), isolating one or more orders of Moiré fringes along the measurement direction by performing a spatial frequency filtering operation on the entire ROI (e.g., by treating the features as having infinite dimensions along an orthogonal direction and applying a 1D filtering operation similar to step 318), and correlating the ROI with a rotated version of itself to determine the axis of symmetry 406.

In another embodiment, the method 300 includes a step 322 of calculating an overlay error between the two sample layers along the measurement direction by dividing the difference between the axes of symmetry of the first and second working zones 204 orthogonal to the measurement direction with a Moiré gain factor. For example, in FIG. 4, both the first working zone 204 and the second working zone 208 have overlapping axes of symmetry 406 orthogonal to the measurement direction (e.g., the X-direction) since FIG. 4 illustrates a case with no overlay error. However, in the case of a physical overlay error, the axis of symmetry 406 will not overlap.

Due to the presence of the Moiré fringes, the difference between the axes of symmetry determined in step 310 is not equal to the physical overlay error between the first and second sample layers. Rather, the difference between the axes of symmetry corresponds to relative shifts of the Moiré fringes. Accordingly, the physical overlay error along a measurement direction may be determined by dividing the difference between the axes of symmetry orthogonal to the measurement direction by a Moiré gain associated with the particular layout of the metrology target 202.

It is recognized herein that the Moiré gain depends on the particular layout of the metrology target 202. For example, the Moiré gain factor ($M_g$) associated with the metrology target 202 in FIG. 2A, where overlay is related to a shift of layer A with respect to layer B, may be characterized as:

$$M_g = M_1 - M_2 = \frac{P}{P-Q} - \frac{S}{S-T} = -\left(\frac{Q}{Q-P} - \frac{T}{T-S}\right). \quad (7)$$

Similarly, the Moiré gain factor associated with a shift of layer A with respect to layer B may be characterized as $-M_g = M_2 - M_1$.

As is evident by equation (7), the Moiré gain is impacted by the conditional Moiré factors associated with the first Moiré pattern 206 and the second Moiré pattern 210, which are in turn functions of the particular values of the grating pitches P, Q, S, and T. Accordingly, the values of the grating pitches P, Q, S, and T may be selected to increase or otherwise optimize the combined Moiré gain and thus the sensitivity to physical overlay errors. For example, the combined Moiré gain may generally be increased by selecting values of the grating pitches P, Q, S, and T such that the Moiré gains of the first working zone 204 and the second working zone 208 have different signs.

Figure 5:
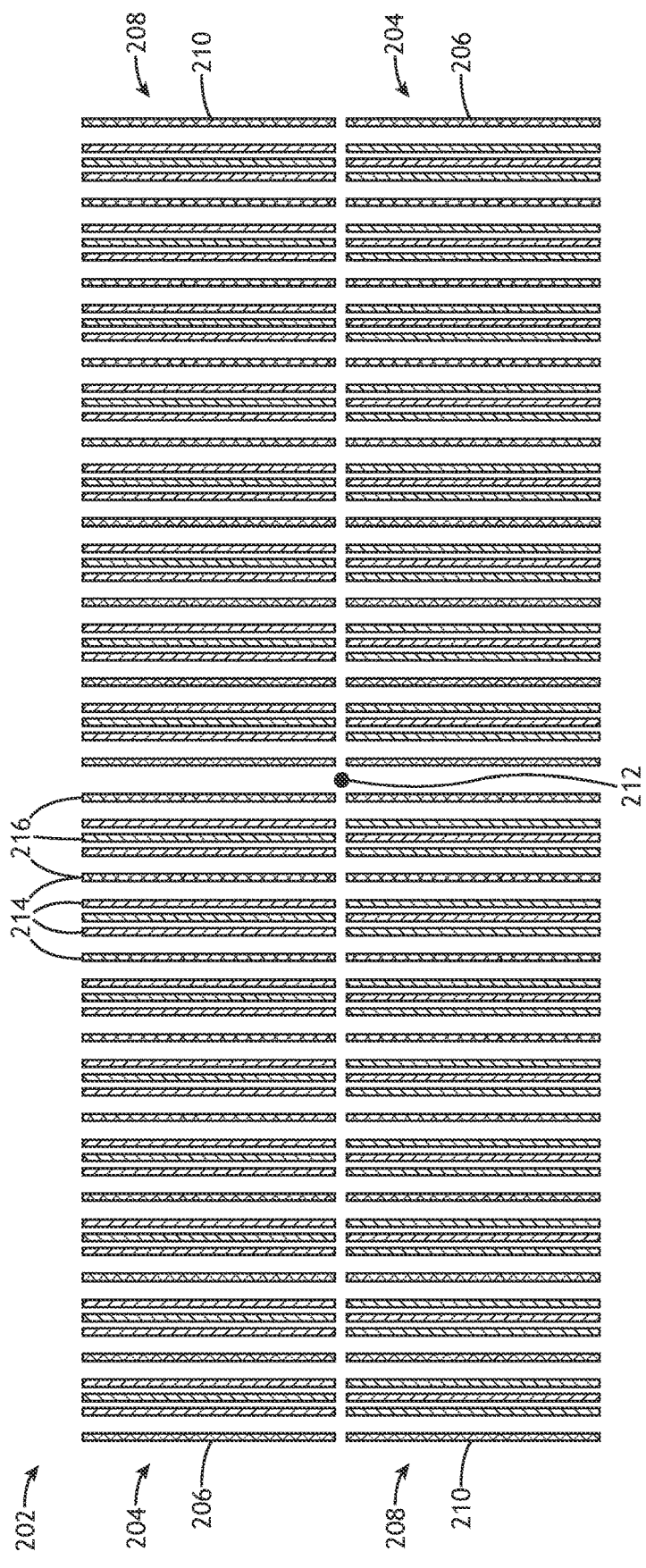
FIG. 5 is a top view of a metrology target including a first working zone including two instances of a first Moiré pattern and a second working zone including two instances of a second Moiré pattern, in accordance with one or more embodiments of the present disclosure.
Figure 6:
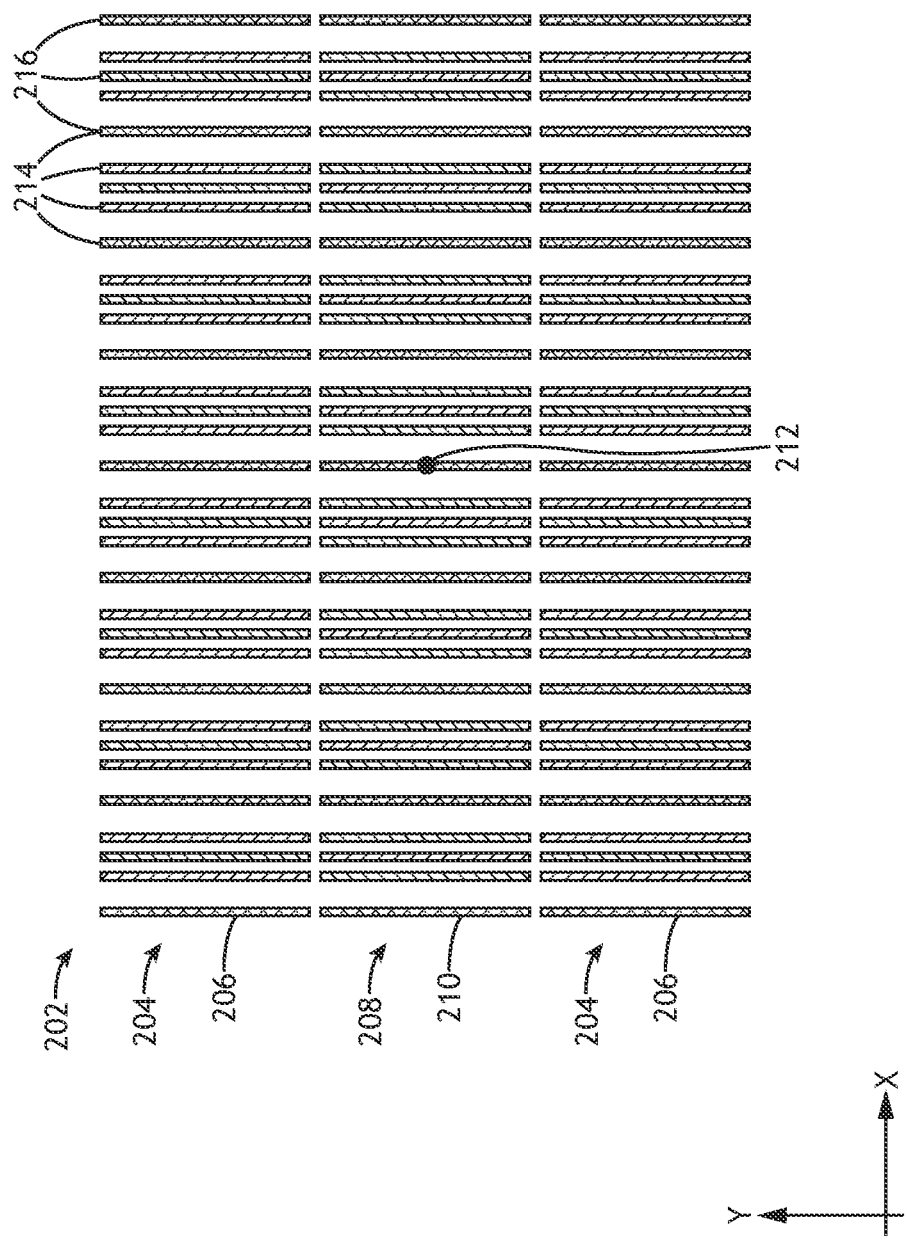
FIG. 6 is a top view of a metrology target including a first working zone including two instances of a first Moiré pattern and a second working zone including a single instance of a second Moiré pattern, in accordance with one or more embodiments of the present disclosure.

Referring now to FIGS. 5 and 6, it is contemplated herein that the method 300 is not limited to the particular geometry of the metrology target 202 illustrated in FIG. 2A. In a general sense, a working zone (e.g., the first working zone 204 or the second working zone 208) may include any number of instances of a Moiré pattern (e.g., the first Moiré pattern 206 or the second Moiré pattern 210), provided that the working zone is rotation and/or reflection symmetric.

FIG. 5 is a top view of a metrology target 202 including a first working zone 204 including two instances of a first Moiré pattern 206 and a second working zone 208 including two instances of a second Moiré pattern 210, in accordance with one or more embodiments of the present disclosure.

FIG. 6 is a top view of a metrology target 202 including a first working zone 204 including two instances of a first Moiré pattern 206 and a second working zone 208 including a single instance of a second Moiré pattern 210, in accordance with one or more embodiments of the present disclosure.

Referring now to FIGS. 7 through 10, the generic Moiré metrology target 202 illustrated in FIG. 2A, as well as the method 300, may be further extended to hybrid metrology targets where one working zone includes one or more instances of a Moiré pattern and a second working zone includes one or more instances of a single-layer structure (e.g., no grating-over-grating structures and no Moiré patterns).

Figure 7:
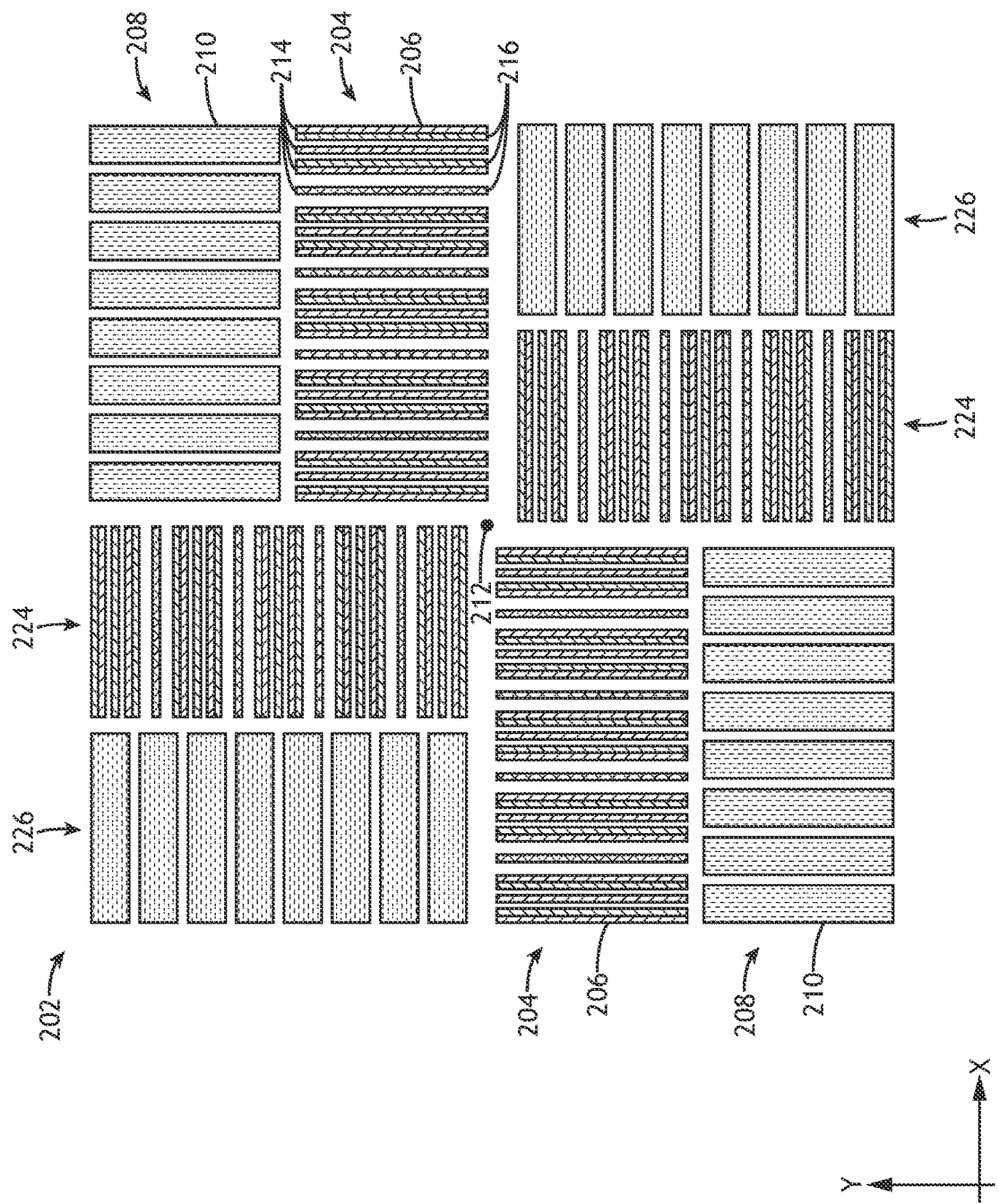
FIG. 7 is a top view of a hybrid metrology target for measurement along two orthogonal directions, where a measurement in each direction is based on one working zone with one or more Moiré patterns and another working zone with one or more single-layer structures, in accordance with one or more embodiments of the present disclosure.

FIG. 7 is a top view of a hybrid metrology target 202 for measurement along two orthogonal directions, where a measurement in each direction is based on one working zone with one or more Moiré patterns and another working zone with one or more single-layer structures, in accordance with one or more embodiments of the present disclosure. In particular, the metrology target 202 illustrated in FIG. 7 represents a variant of FIG. 2A in which T=0 and there is no grating structure on layer A for the second working zone 208. Accordingly, the Moiré gain ($M_g$) for this metrology target 202 related to a shift of layer A with respect to layer B is:

$$M_g = \frac{P}{P-Q} - \frac{S}{S-T} = \frac{P}{P-Q} - \frac{S}{S-0} = \qquad (8)$$
$$\frac{P}{P-Q} - 1 = -\frac{Q}{Q-P} = -\left(\frac{Q}{Q-P} - \frac{0}{0-S}\right) = -\left(\frac{Q}{Q-P} - \frac{T}{T-S}\right).$$

Further, the third working zone 224 and the fourth working zone 226 of the metrology target 202, illustrated in FIG. 7, are rotated versions of the first working zone 204 and the second working zone 208 to provide similar measurements along the Y direction. However, it is to be understood that FIG. 7 and the associated description are provided solely for illustrative purposes and should not be interpreted as limiting. Hybrid targets are not limited to the layout illustrated in FIG. 7. For example, the working zones in either the X or Y directions may have any rotationally symmetric distribution of features. By way of another example, the single layer features in the second working zone 208 may include non-periodic features and are thus not limited to the grating structures illustrated in FIG. 7.

Figure 8:
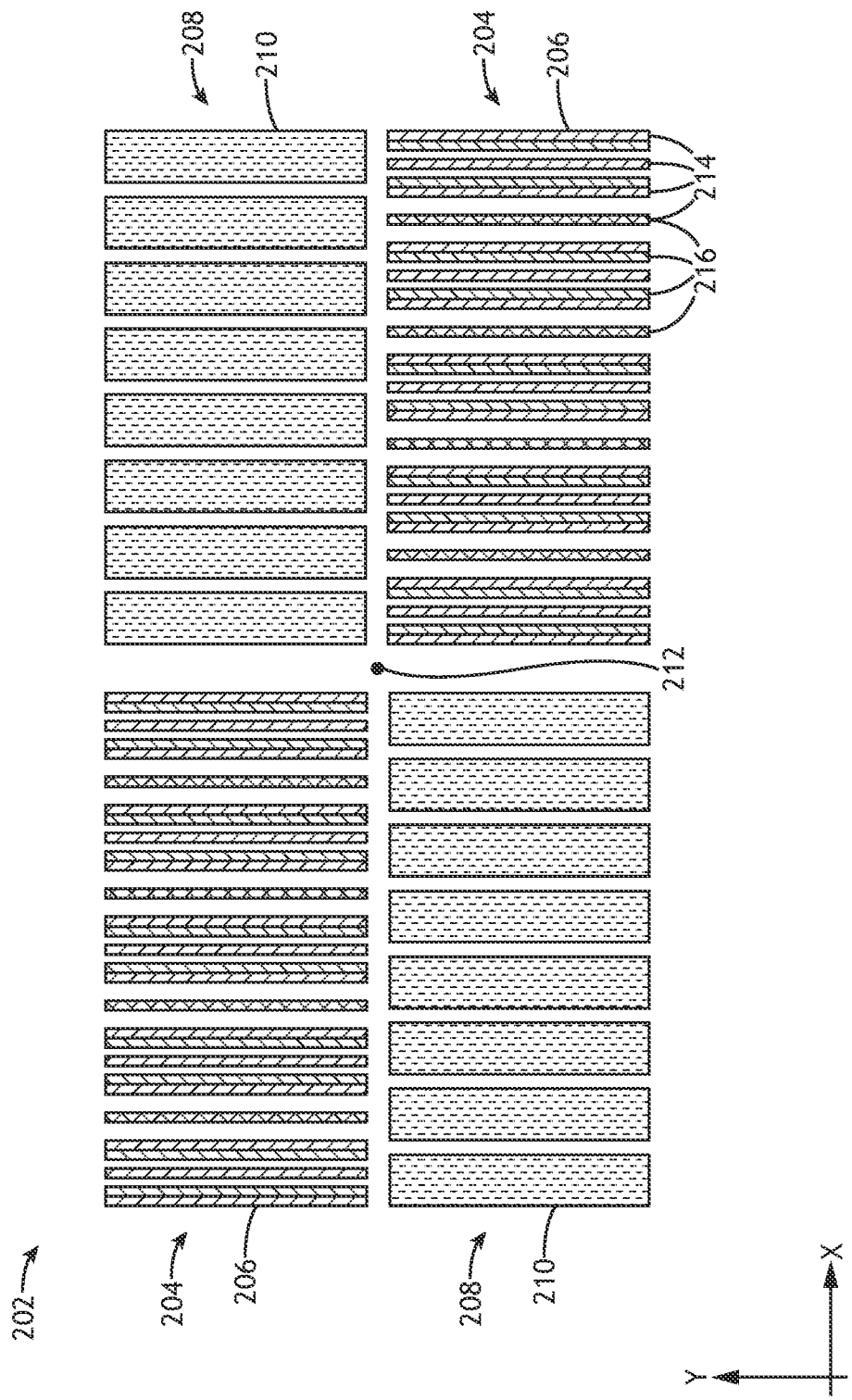
FIG. 8 is a top view of a metrology target for measurement along a single direction including a first working zone including two instances of a first Moiré pattern and a second working zone including two instances of a single-layer grating structure, in accordance with one or more embodiments of the present disclosure.

FIG. 8 is a top view of a metrology target 202 for measurement along a single direction (e.g., the X direction) including a first working zone 204 including two instances of a first Moiré pattern 206 and a second working zone 208 including two instances of a single-layer grating structure (e.g., on layer A or layer B), in accordance with one or more embodiments of the present disclosure.

Figure 9:
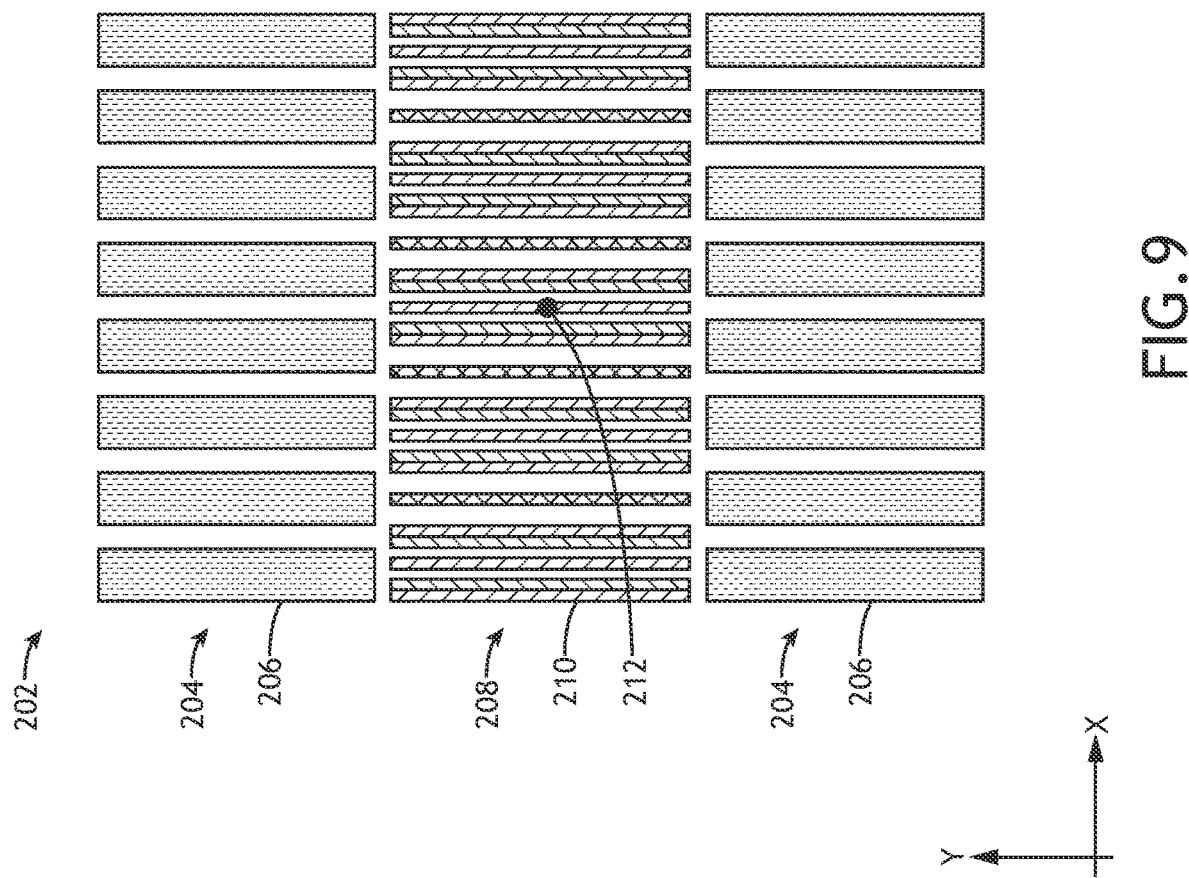
FIG. 9 is a top view of a metrology target for measurement along a single direction, in accordance with one or more embodiments of the present disclosure.

FIG. 9 is a top view of a metrology target 202 for measurement along a single direction (e.g., the X direction), in accordance with one or more embodiments of the present disclosure. In particular, the first working zone 204 includes a single instance of a Moiré pattern 902 and the second working zone 208 includes two instances of a single-layer grating structure (e.g., on layer A or layer B).

It is contemplated herein that FIGS. 8 and 9 illustrate examples of two non-Moiré patterns in one working zone and one or two Moiré patterns in another working zone. However, it is to be understood that additional variations are within the spirit and scope of the present disclosure. In a general sense, the first working zone 204 may include any number of Moiré patterns in any rotationally-symmetric distribution and the second working zone 208 may include any number of non-Moiré patterns in any rotationally-symmetric distribution.

As described previously herein, a working zone including one or more non-Moiré patterns (e.g., as a reference for a working zone with one or more Moiré patterns) may have any rotationally-symmetric distribution of periodic or non-periodic features. Further, a working zone with non-Moiré features may, but are not required to, overlap partially or completely with a working zone with Moiré patterns.

Figure 10:
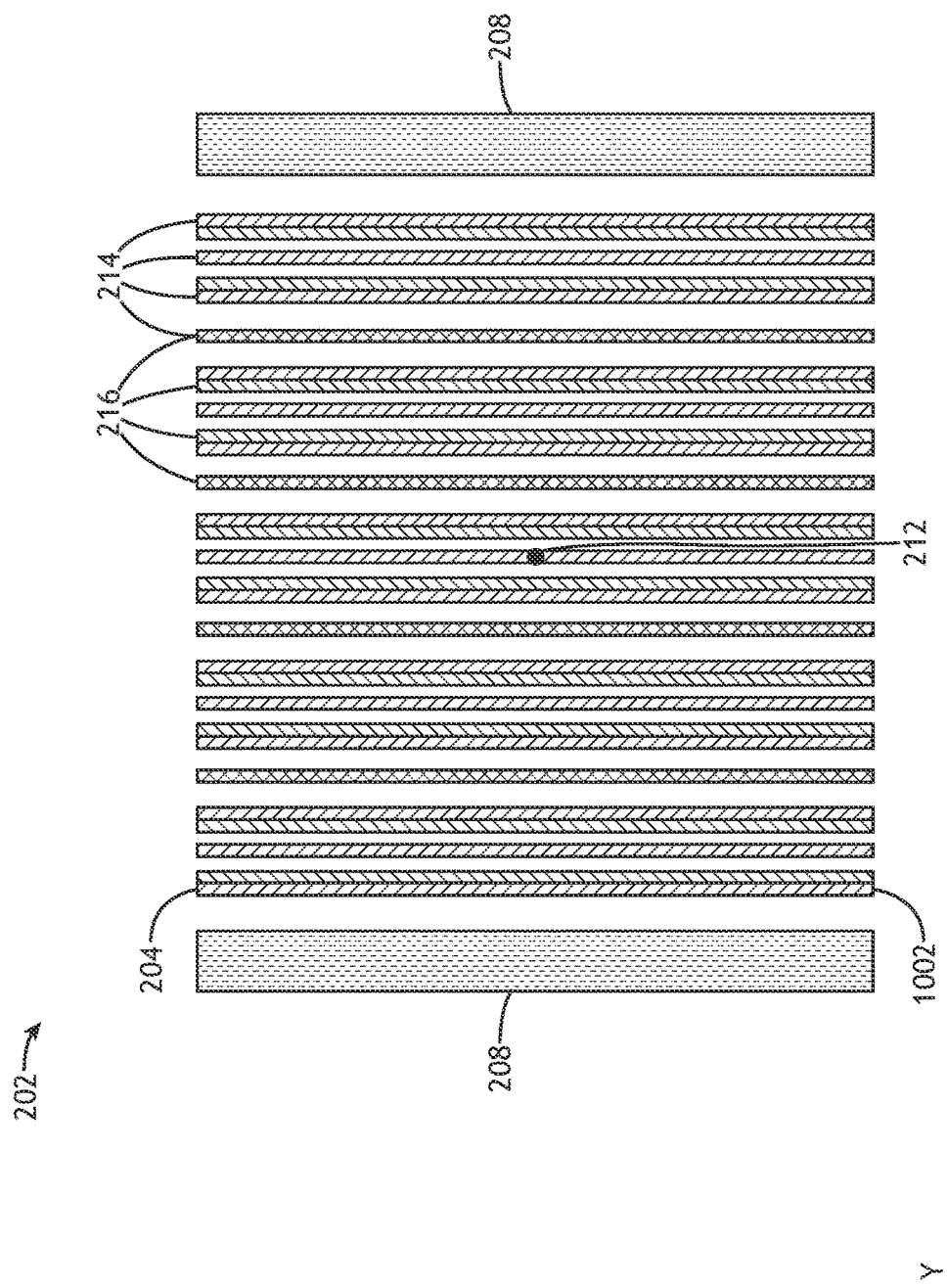
FIG. 10 is a top view of a Moiré-in-box metrology target, where the first working zone includes a single instance of a Moiré pattern and the second working zone includes non-periodic single-layer structures surrounding the Moiré pattern, in accordance with one or more embodiments of the present disclosure.
Figure 11A:
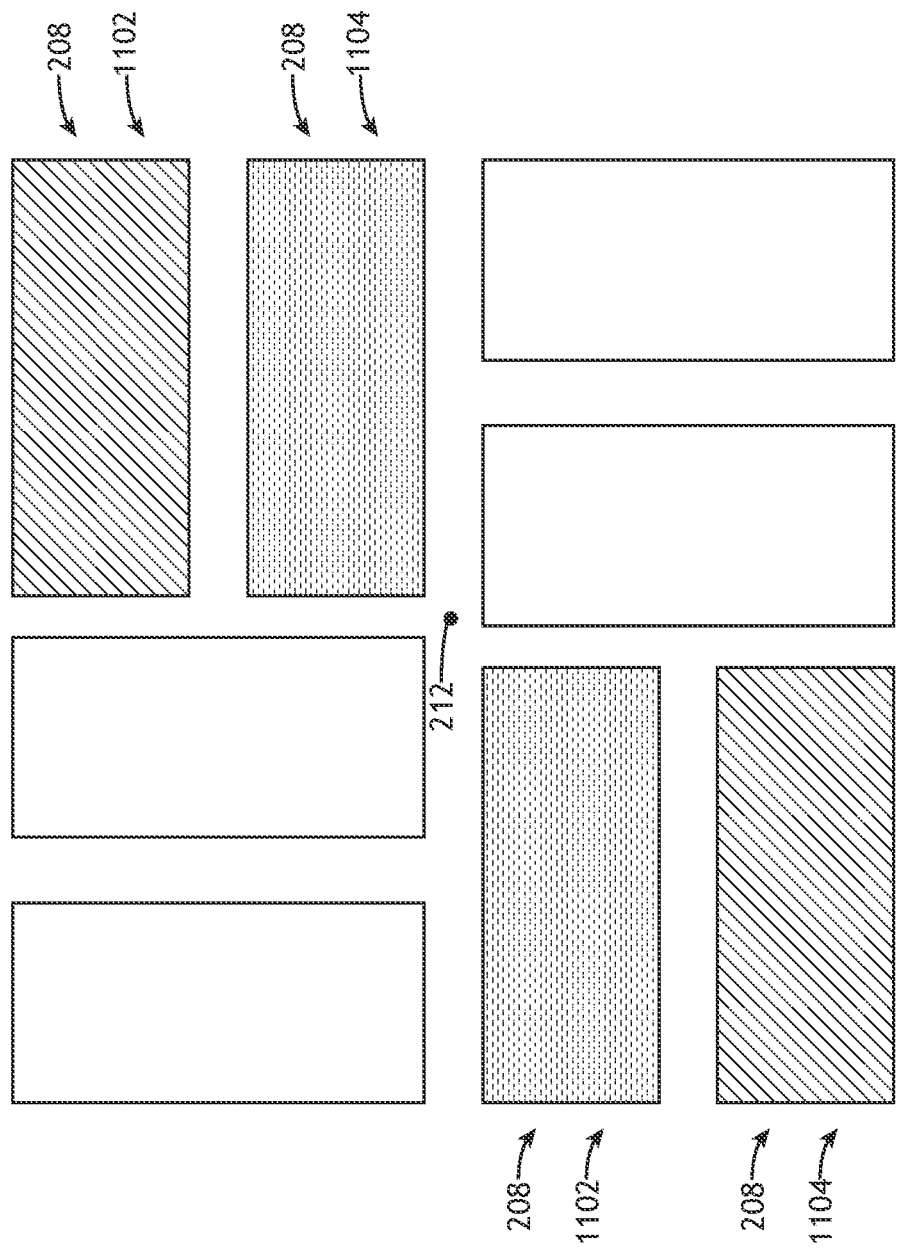
FIG. 11A is a top block diagram view of a three-layer metrology target having Moiré patterns based on grating-over-grating structures across multiple layers, in accordance with one or more embodiments of the present disclosure.

FIG. 10 is a top view of a Moiré-in-box metrology target 202, where the first working zone 204 includes a single instance of a Moiré pattern 1002 and the second working zone 208 includes non-periodic single-layer structures surrounding the Moiré pattern 1002, in accordance with one or more embodiments of the present disclosure. In FIG. 10, the Moiré pattern 1002 includes grating-over-grating structures having periodicity in the X-direction only such that the metrology target 202 in FIG. 10 may be used to provide overlay measurements in the X direction (e.g., in accordance with method 300). However, it is to be understood that the example metrology target 202 in FIG. 10 is provided solely for illustrative purposes and should not be interpreted as limiting. In one embodiment, though not shown, a Moiré-in-box target includes a 2D Moiré pattern with grating-over-grating structures having periodicity along both the X and Y directions to provide overlay measurements along both the X and Y directions.

Referring now to FIGS. 11A-12B, in some embodiments, the metrology target 202 includes a reference layer. In this regard, the structures in the reference layer may interact optically with structures in the additional layers to provide device-like metrology targets (e.g., targets having features having similar size, density, and/or pitch as device features). Device-like metrology targets including a reference layer are generally described in U.S. Patent Application No. 2018/0188663, published on Jul. 5, 2018, which is incorporated herein by reference in its entirety.

Figure 11B:
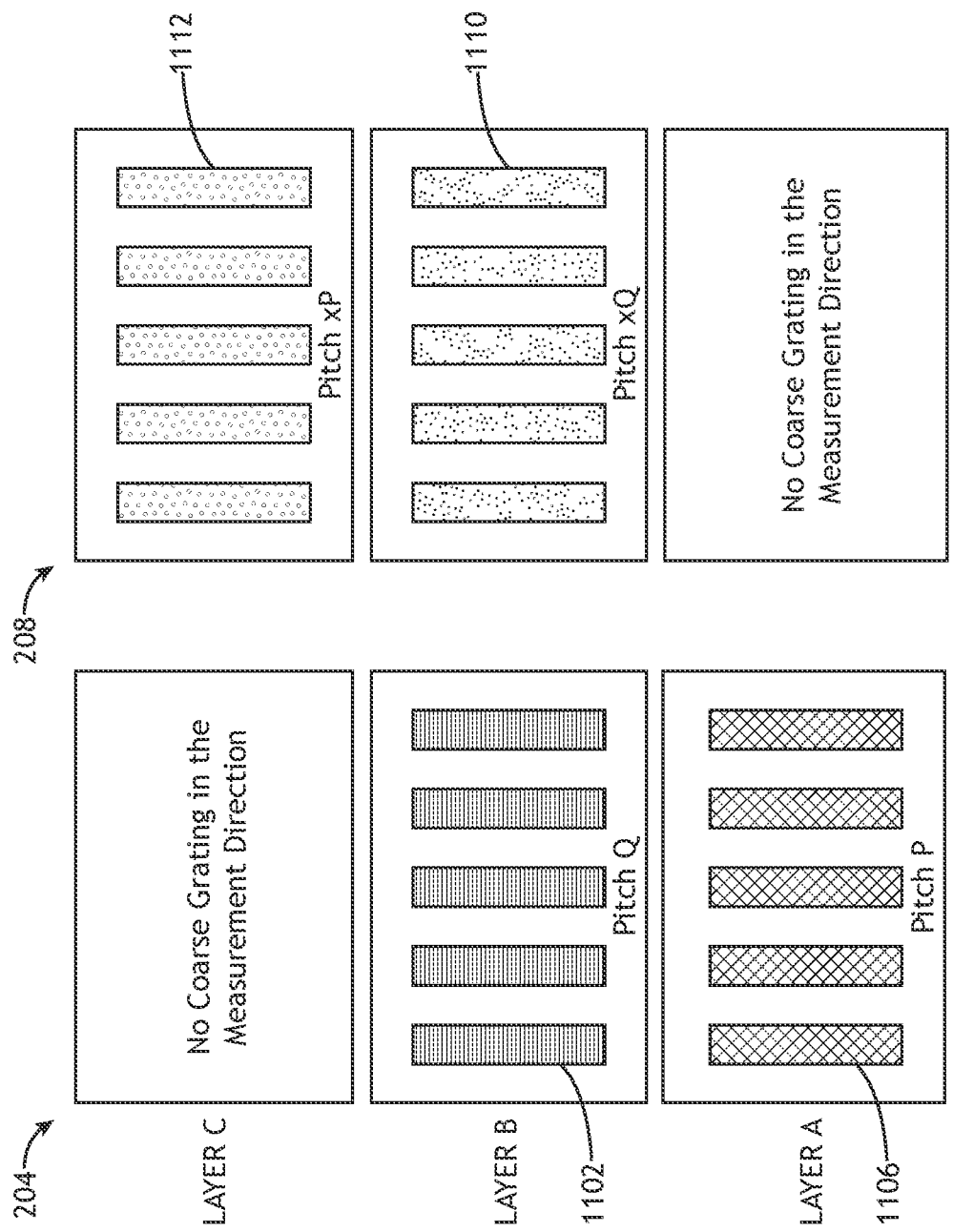
FIG. 11B is a conceptual view of multi-layer grating structures in the Moiré patterns of FIG. 11A, in accordance with one or more embodiments of the present disclosure.

FIG. 11A is a top block diagram view of a three-layer metrology target 202 having Moiré patterns based on grating-over-grating structures across multiple layers, in accordance with one or more embodiments of the present disclosure. FIG. 11B is a conceptual view of multi-layer grating structures in the Moiré patterns of FIG. 11A, in accordance with one or more embodiments of the present disclosure. In one embodiment, the metrology target 202 includes a first working zone 204 including two instances of a first Moiré pattern 1102 and a second working zone 208 including two instances of a second Moiré pattern 1104. As illustrated in FIG. 11B, the first Moiré pattern 1102 is formed from a grating structure 1106 having a pitch P in a first layer (layer A), a grating structure 1108 having a pitch Q in a reference layer (layer B), and no grating structure in a third layer (layer C), where P≠Q. Further, the second Moiré pattern 1104 is formed from a grating structure 1110 having a pitch x·Q in the reference layer (layer B) and a grating structure 1112 having a pitch x·P in the third layer (layer A), where x is a positive number (e.g., a rational number). In this regard, both the first Moiré pattern 1102 and the second Moiré pattern 1104 incorporate structures in the reference layer. Further, the reference layer structures need not have the same pitch in the first Moiré pattern 1102 and the second Moiré pattern 1104.

It is contemplated herein that the metrology target 202 in FIG. 11A is suitable for providing overlay measurements between layers A and C. The Moiré gain ($M_g$) associated with a shift of layer A with respect to layer B for this metrology target 202 is:

$$M_g = \frac{Q}{P-Q}. \qquad (9)$$

Figure 11C:
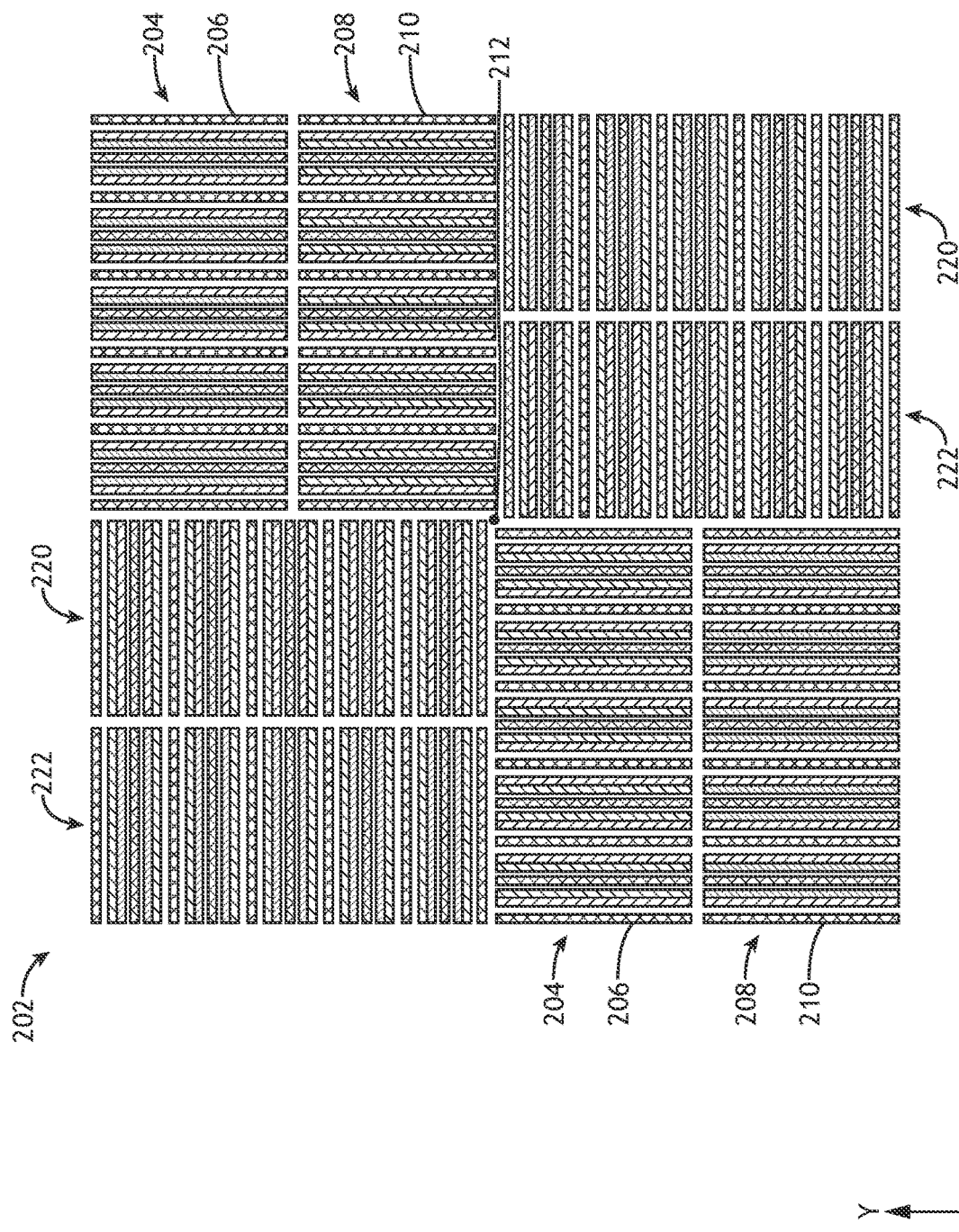
FIG. 11C is a top view of a metrology target based on FIGS. 11A and 11B for measurement along two orthogonal directions, in accordance with one or more embodiments of the present disclosure.

FIG. 11C is a top view of a metrology target 202 based on FIGS. 11A and 11B for measurement along two orthogonal directions, in accordance with one or more embodiments of the present disclosure. In particular, the metrology target 202 illustrated in FIG. 11C represents an example in which x=1.

It is to be understood that FIGS. 11A-11C and the associated descriptions are provided solely for illustrative purposes and should not be interpreted as limiting. In some embodiments, the metrology target 202 includes at least one working zone with a Moiré pattern having three overlapping gratings in three layers, where one layer is a reference layer. In this regard, the overlays between the other two pairs of layers may be recovered either algorithmically (e.g., by filtering one or more measurement signals to isolate or suppress desired spatial frequencies and/or Moiré fringes) or physically (e.g., using additional working zones).

Figure 12A:
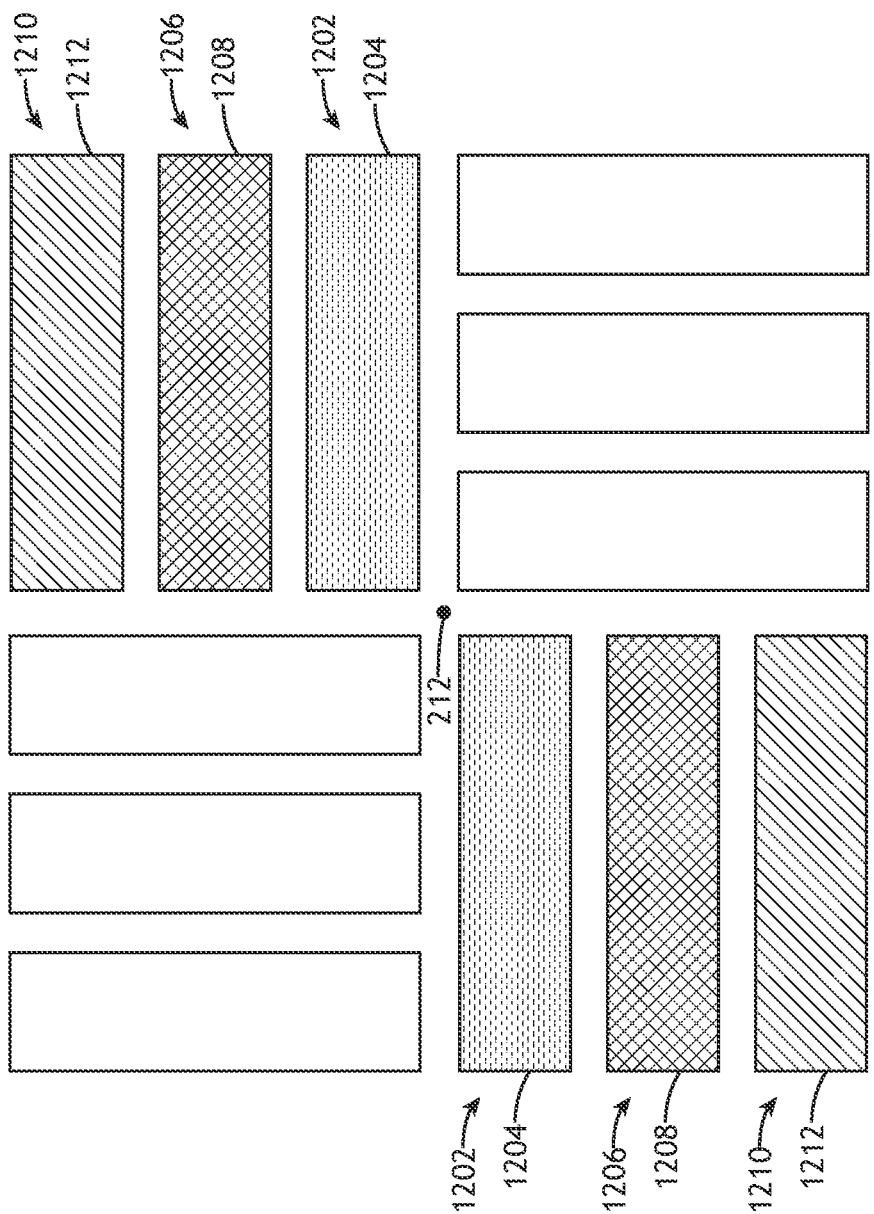
FIG. 12A is a top block diagram view of a triple-Moiré metrology target, in accordance with one or more embodiments of the present disclosure.
Figure 12B:
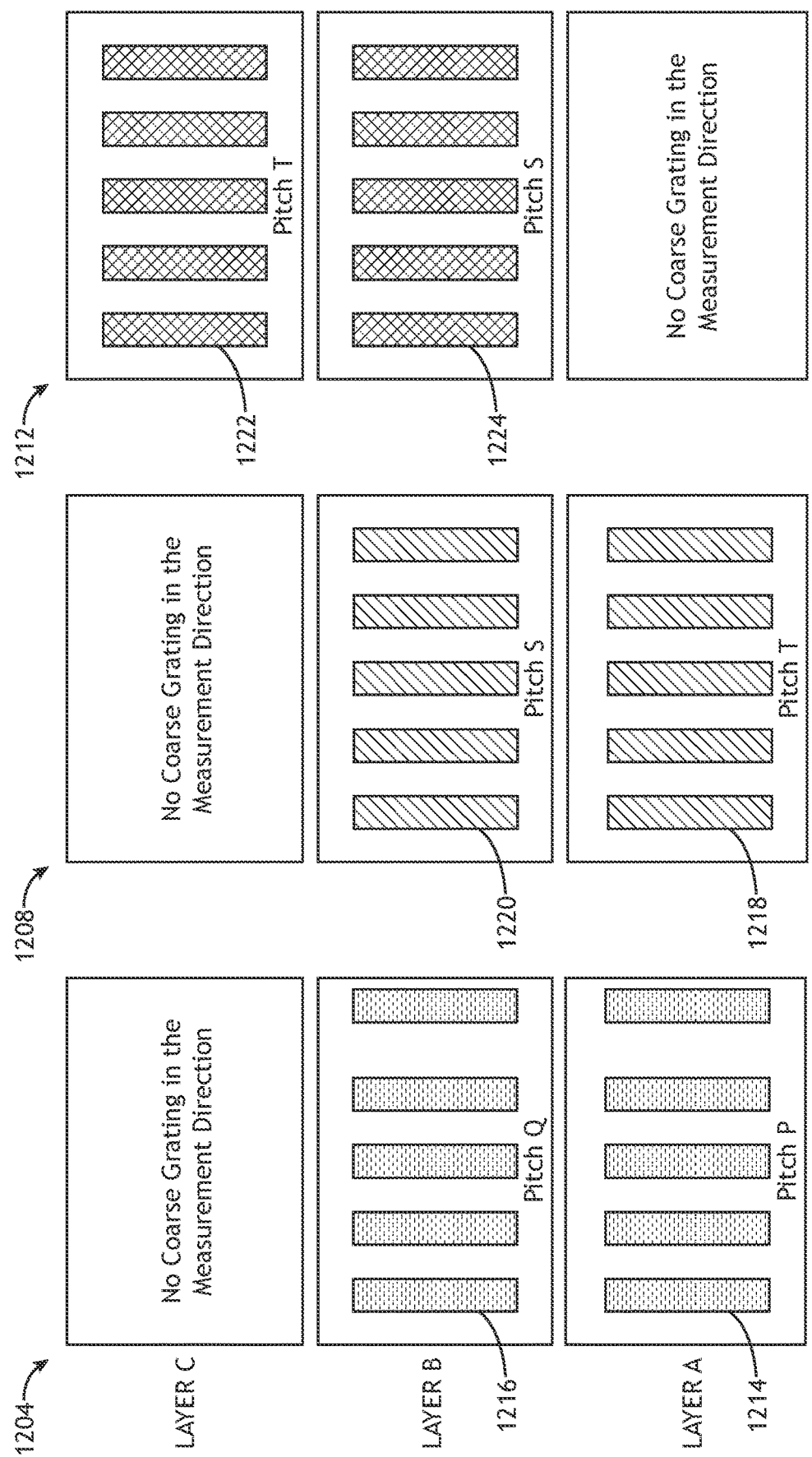
FIG. 12B is a conceptual view of multi-layer grating structures in the Moiré patterns of FIG. 12A, in accordance with one or more embodiments of the present disclosure.
Figure 13A:
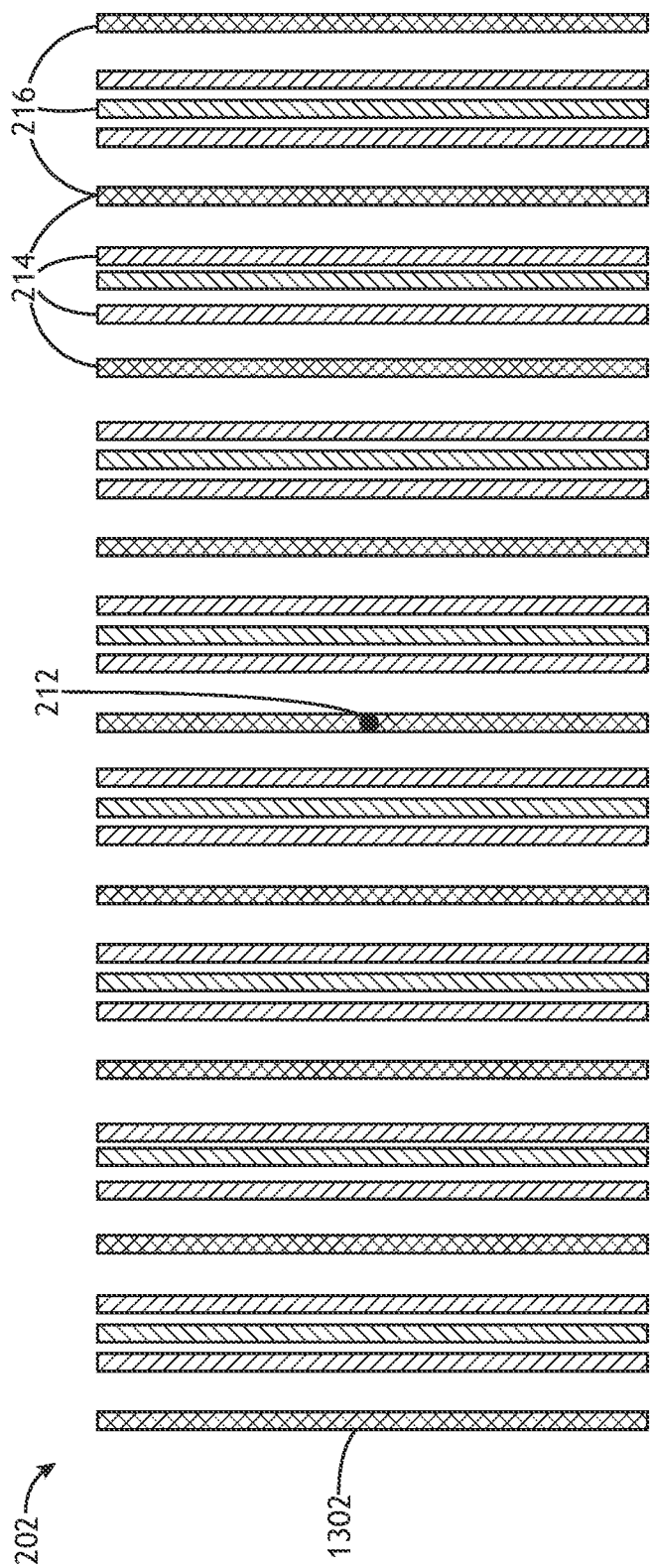
FIG. 13A is a top view of a metrology target including a single Moiré pattern suitable for providing overlay measurements along a single direction based on images generated with multiple optical configurations, in accordance with one or more embodiments of the present disclosure.

FIG. 12A is a top block diagram view of a triple-Moiré metrology target 202, in accordance with one or more embodiments of the present disclosure. FIG. 12B is a conceptual view of multi-layer grating structures in the Moiré patterns of FIG. 12A, in accordance with one or more embodiments of the present disclosure. In one embodiment, the metrology target 202 includes a first working zone 1202 including two instances of a first Moiré pattern 1204, a second working zone 1206 including two instances of a second Moiré pattern 1208, and a third working zone 1210 with two instances of a third Moiré pattern 1212. As illustrated in FIG. 12B, the first Moiré pattern 1204 is formed from a grating structure 1214 having a pitch Q in a first layer (layer A), a grating structure 1216 having a pitch P in a second layer (layer B), and no grating structure in a third layer (layer C), where P≠Q. The second Moiré pattern 1208 is formed from a grating structure 1218 having a pitch T in the first layer (layer A) and a grating structure 1220 having a pitch S in the second layer (layer B), where T≠S. The third Moiré pattern 1212 is formed from a grating structure 1222 having a pitch T in the third layer (layer C) and a grating structure 1224 having a pitch S in the second layer (layer B).

It is contemplated herein that the metrology target 202 in FIG. 12A is suitable for providing overlay measurements between layers A and C or between layers A and B. The Moiré gain ($M_g$) associated with a shift of layer A with respect to layer B for this metrology target 202 is:

$$M_g = \frac{P}{P-Q} - \frac{S}{S-T}. \tag{10}$$

The Moiré gain ($M_g$) associated with a shift of layer A with respect to layer C for this metrology target 202 is:

$$M_g = \frac{T}{S-T}. \tag{11}$$

It is to be understood that FIGS. 12A and 12B and the associated descriptions are provided solely for illustrative purposes and should not be interpreted as limiting. For example, a triple Moiré metrology target 202 may generally include additional variations of arrangements of grating structures spanning the three-layers. In one embodiment, a triple Moiré metrology target 202 includes a first working zone 1202 having a Moiré pattern based on grating structures on layers A and B, a second working zone 1206 having grating structures on layers B and C, and a third working zone 1210 including grating structures on layers A and C. Such a target may also be suitable for overlay measurements between layers A and B as well as between layers B and C. Further, a metrology target 202 may generally have any number of layers. For example, a N-tuple metrology target 202 may have N layers with grating structures on selected layers to provide overlay measurements between the selected layers.

Referring now to FIGS. 13A-14, metrology of overlay targets having a single working zone with one or more instances of a Moiré pattern for measurement in a single direction is described in greater detail.

It is contemplated herein that the information content associated with an image of the Moiré pattern 1302 may vary based on the optical conditions associated with the generation of the image such as, but not limited to, the wavelength of illumination used to generate an image (e.g., the wavelength of the illumination beam 108), the incidence angle of the illumination, or the focal position of a detector used to generate an image (e.g., the detector 104). For example, the Moiré fringes may be observable in some optical configurations, but not others. Similarly, one or more of the underlying grating structures may be visible in some optical configurations, but not others. Accordingly, the axes of symmetry of two images of a single Moiré pattern taken under different optical configurations may differ in much the same way as described with respect to FIGS. 2A through 6.

FIG. 13A is a top view of a metrology target 202 including a single Moiré pattern 1302 suitable for providing overlay measurements along a single direction based on images generated with multiple optical configurations, in accordance with one or more embodiments of the present disclosure. For example, the metrology target 202 of FIG. 13A may be suitable for measurement along a single direction (e.g., the X direction) based on an image generated under a condition where Moiré fringes are detectable and an image generated under a condition where at least one of the underlying gratings of the Moiré pattern 1302 is detectable.

It is contemplated herein that the metrology target 202 illustrated in FIG. 13 may be approximately 3-4 times smaller than a target designed using typical approaches, which may substantially reduce the space on a sample 102 that must be dedicated to metrology.

Figure 13B:
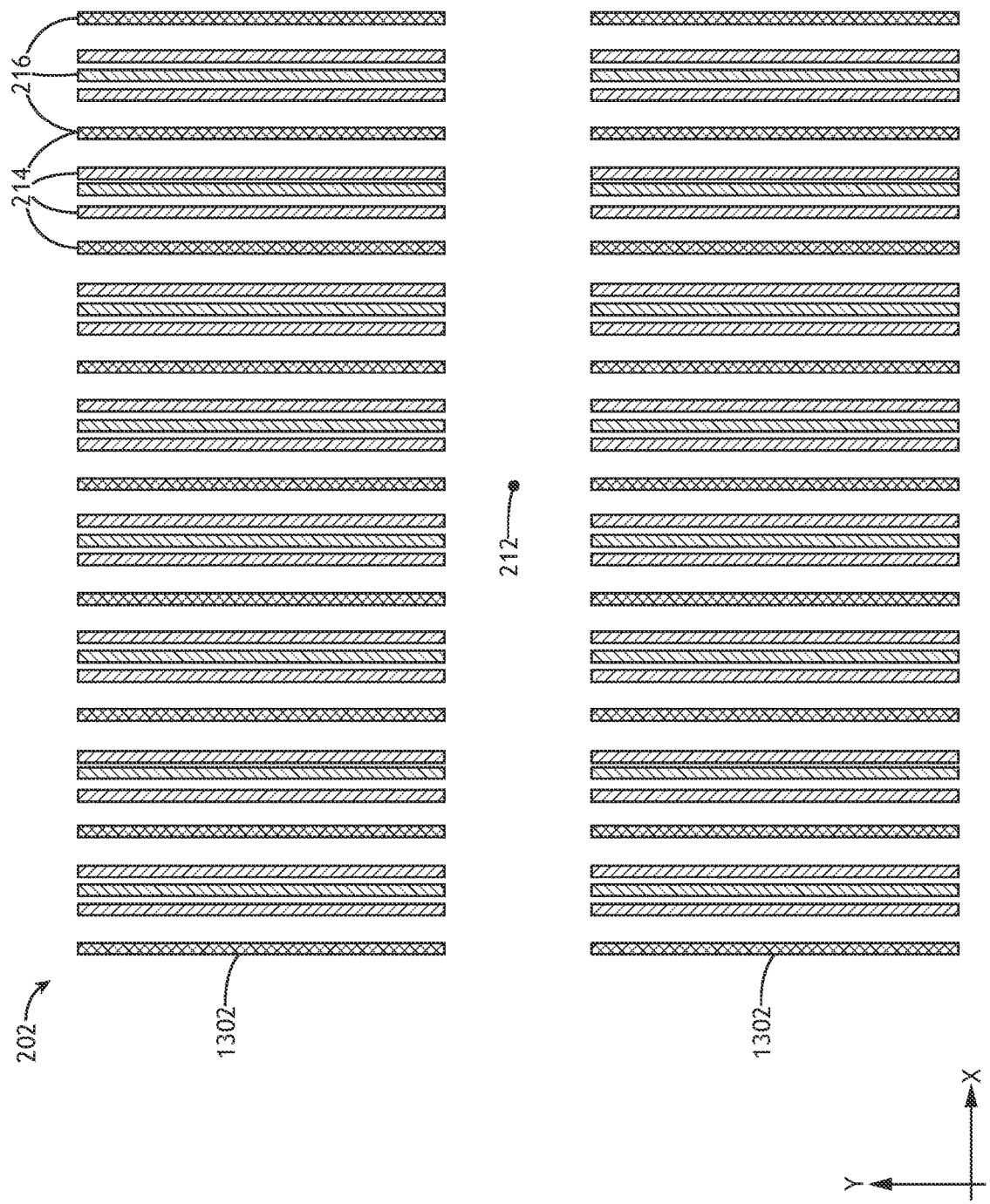
FIG. 13B is a top view of a metrology target including a working zone with two instances of a Moiré pattern suitable for providing overlay measurements along a single direction based on images generated with multiple optical configurations, in accordance with one or more embodiments of the present disclosure.
Figure 14:
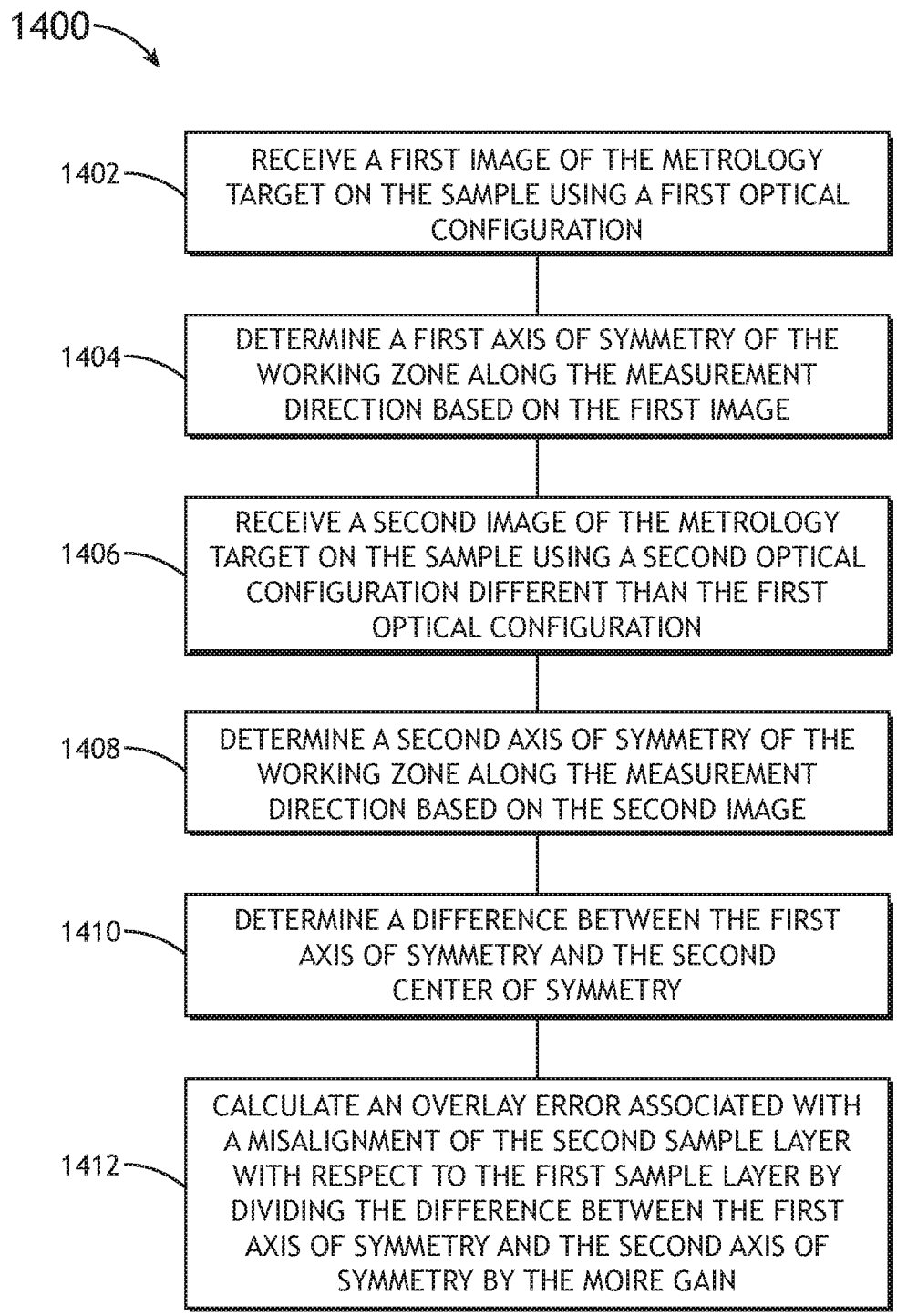
FIG. 14 is a flow diagram illustrating steps performed in a method for measuring overlay, in accordance with one or more embodiments of the present disclosure.

FIG. 13B is a top view of a metrology target 202 including a working zone 1304 with two instances of a Moiré pattern 1302 suitable for providing overlay measurements along a single direction based on images generated with multiple optical configurations, in accordance with one or more embodiments of the present disclosure. Like FIG. 13A, the metrology target 202 illustrated in FIG. 13B may be suitable for measurement along a single direction (e.g., the X direction) based on an image generated under a condition where Moiré fringes are detectable and an image generated under a condition where at least one of the underlying gratings of the Moiré pattern 1302 is detectable.

Further, the use of multiple instances of Moiré patterns 1302 in the metrology target 202 illustrated in FIG. 13B provides the flexibility of spreading the metrology target 202 across the sample 102. That is, various elements including, but not limited to, device features, may be located between various features of the metrology target 202.

FIG. 14 is a flow diagram illustrating steps performed in a method 1400 for measuring overlay, in accordance with one or more embodiments of the present disclosure. Applicant notes that the embodiments and enabling technologies described previously herein in the context of the metrology system 100 should be interpreted to extend to the method 1400. It is further noted, however, that the method 1400 is not limited to the architecture of the metrology system 100.

In one embodiment, the method 1400 includes a step 1402 of receiving a first image of the metrology target on the sample using a first optical configuration, where the metrology target as a working zone with one or more instances of a Moiré pattern (e.g., the first Moiré pattern 206). In another embodiment, the method 1400 includes a step 1404 of determining a first axis of symmetry of the working zone along the measurement direction based on the first image. In another embodiment, the method 1400 includes a step 1406 of receiving a second image of the metrology target on the sample using a second optical configuration different than the first optical configuration. In another embodiment, the method 1400 includes a step 1408 of determining a second axis of symmetry of the working zone along the measurement direction based on the second image.

Further, the images generated in step 1402 and step 1406 based on the different optical configurations may be generated either sequentially or simultaneously. For example, the associated optical conditions may be generated (e.g., by the metrology system 100) either sequentially or simultaneously.

In another embodiment, the method 1400 includes a step 1410 of determining a difference between the first axis of symmetry and the second axis of symmetry.

It is contemplated herein that it may be desirable to filter the spatial frequencies of either the first or second image in order to isolate a desired signal. Techniques described in the step 318 in FIG. 3B for isolating Moiré fringes may generally be used to isolate any selected set of spatial frequencies such as, but not limited to, spatial frequencies associated with one of the grating structures in the Moiré fringes or spatial frequencies associated with any selected order of Moiré fringes.

For example, it may be desirable to provide a first optical configuration in which only the Moiré fringes are resolvable and neither of the underlying grating structures are desirable. However, if one or both of the underlying grating structures are visible, then the Moiré fringes may be isolated prior to determining the axis of symmetry. By way of another example, it may be desirable to provide a second optical configuration in which only one of the underlying grating structures is resolvable (e.g., to operate as a "reference layer" described previously herein). However, if the Moiré fringes or the other grating structure are resolvable, then the desired grating structure may be isolated.

In another embodiment, the method 1400 includes a step 1412 of calculating an overlay error associated with a misalignment of the second sample layer with respect to the first sample layer by dividing the difference between the first axis of symmetry and the second axis of symmetry by the Moiré gain.

It is recognized herein that the method 1400 may be substantially similar to the method 300 above. However, the Moiré gain may differ based on which structures are resolved in the two images (e.g., in step 1402 and 1404). For example, in the case that one optical configuration resolves the Moiré fringes and a second optical configuration resolves the Moiré fringes, if an optical configuration receives the layer A, the Moiré gain ($M_g$) may be characterized as:

$$M_C = \frac{P}{P-Q}, \quad (10)$$

with the sign depending on which layer serves as the frame of reference. Similarly, in the case that one optical configuration resolves the Moiré fringes and a second optical configuration resolves the Moiré fringes, if an optical configuration receives the layer B, the Moiré gain ($M_g$) may be characterized as:

$$M_C = \frac{Q}{Q-P}. \quad (11)$$

The method 1400 may also be applied to any type of metrology target having a Moiré pattern including, but not limited to, any of the targets described herein. In this regard, different optical configurations providing different image content may be utilized to generate additional information from any working zone including a Moiré pattern.

It should be understood that FIGS. 2A through 14 are provided solely for illustrative purposes and should not be interpreted as limiting. In some embodiments, a metrology target 202 includes a working zone with one or more instances of a Moiré pattern including gratings on three or more layers, where the gratings may each have a different pitch. In this regard, an image of the Moiré pattern may include double, triple, or higher scattering signals associated with Moiré fringes arising from interference between the three or more gratings. It is further contemplated herein that a Moiré pattern based on three or more overlapping gratings may be incorporated into various designs of a metrology target 202 and may be suitable for analysis using multiple algorithms. For example, the method 1400 may be applied to extract an overlay between two sample layers of such a metrology target 202 based on multiple images of the Moiré pattern with different optical configurations selected to detect Moiré fringes between different sample layers and/or detect any of the underlying grating structures. In one instance, different optical configurations may be generated in which different Moiré patterns (e.g., interference between different sample layers) are visible. By way of another example, as described previously herein, any of the techniques described with respect to step 318 of the method 312 for isolating Moiré fringes (e.g., Fourier filtering) may be applied to isolate any selected spatial frequency such as, but not limited to, spatial frequencies associated with Moiré fringes between different sample layers and/or any of the underlying grating structures. By way of another example, the method 300 may be applied to generate an overlay measurement between two sample layers based on a comparison of an axis of symmetry of the working group with the Moiré pattern with the axis of symmetry of another working group along a measurement direction. In this regard, additional layers of the Moiré pattern may be used as reference layers. Further, an overlay measurement may be based on any combination of the above techniques.

It is recognized herein that the particular design parameters of grating-over-grating Moiré patterns as described herein may influence various aspects of the associated Moiré fringes such as, but not limited to, the number of Moiré fringes, the period of Moiré fringes, the order of Moiré fringes (e.g., $1^{st}$-order, $2^{nd}$-order, or the like), the contrast of Moiré fringes, or cross-talk between adjacent Moiré patterns. For example, Moiré fringes may be generally influenced by target design parameters (e.g., the pitch of the grating structures, the duty cycle of the grating structures, feature segmentation providing features with design-level dimensions, exclusion zone size, overall target dimensions, or the like), metrology tool parameters, stack parameters (e.g., including information of the printing/patterning process), and/or lithography tool parameters.

Accordingly, in some embodiments, one or more aspects of the metrology target design, the metrology tool measurement recipe, the lithography tool recipe, or the like are selected based on simulations and/or measurements of test targets. For example, a design of experiments may be generated in which a series of candidate parameters (e.g., target design parameters, metrology tool parameters, lithography tool parameters, or the like) are systematically varied. The performance of each set of candidate parameters may be evaluated through any combination of simulations and fabrication/measurement of test targets. Then, a set of parameters may be selected from the set of candidate parameters based on any selected metric or combination of metrics such as, but not limited to, contrast of a Moiré fringe pattern, a Moiré fringe period, generation of a selected Moiré fringe order, overlay accuracy, measurement repeatability, robustness to variations of the optical configuration of the imaging system, or robustness to variations of the Moiré pattern.

In some embodiments, Maxwell-based simulations are utilized to optimize the parameters associated with grating structures on one or more working zones that include at least one Moiré pattern. The Maxwell-based simulations may include any type of simulation incorporating Maxwell's equations such as, but not limited to, a rigorous coupled-wave analysis (RCWA) simulation. For example, Maxwell-based simulations may be, but are not required to be, performed using AcuRate software from KLA Corporation. Further, optical cross-talk between adjacent Moiré patterns may be simulated using either Maxwell-based approximations or simpler approximations such as the Kirchoff approximation assuming Fourier optical effects.

In some embodiments, tool parameters (e.g., metrology tool parameters, lithography tool parameters, or the like) are optimized by first identifying a selected number of candidate sets of target design parameters based on simulations, fabricating only these selected candidate sets, and measuring the performance using various tool parameters. Then, the best combination of design parameters and tool parameters may be selected based on a desired performance metric. In this regard, the use of simulations to narrow the number of fabricated test samples may efficiently provide selection of optimal parameters.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A metrology system comprising:
an imaging system comprising:
an illumination source to generate illumination;
one or more illumination optics to direct illumination from the illumination source to a metrology target, the metrology target comprising:
a working zone including a single instance of a Moiré pattern, wherein the working zone is rotationally symmetric, wherein the Moiré pattern includes a grating structure with a first pitch ($p_1$) along a measurement direction on a first sample layer and a grating structure with a second pitch ($p_2$) along the measurement direction on a second sample layer, wherein the second pitch is different than the first pitch;
a detector to generate an image of the metrology target based on the illumination from the illumination source, wherein an optical configuration of the imaging system is configurable according to at least a first optical configuration and a second optical configuration, wherein the first optical configuration and the second optical configuration differ by at least one of a wavelength of the illumination, a polarization of the illumination incident on the metrology target, an angle of the illumination incident on the metrology target, or a focal position of the metrology target;
a controller configured to be coupled to the imaging system, the controller including one or more processors configured to execute program instructions causing the one or more processors to:
receive a first image of the working zone including the single instance of the Moiré pattern using the first optical configuration, wherein the first image includes first Moiré fringes associated with the Moiré pattern with a Moiré pitch related to a difference between the first pitch and the second pitch;
determine a first axis of symmetry of the working zone along the measurement direction based at least in part on positions of the first Moiré fringes the first image;
receive a second image of the working zone including the single instance of the Moiré pattern using the second optical configuration, wherein the second image includes second Moiré fringes associated with the Moiré pattern with the Moiré pitch;
determine a second axis of symmetry of the working zone along the measurement direction based at least in part on positions of the second Moiré fringes in the second image;
determine an optical overlay measurement based on a difference between the first axis of symmetry and the second axis of symmetry; and
calculate an overlay error along the measurement direction associated with the first sample layer and the second sample layer by adjusting the difference between the axes of symmetry in the first image and the second image by a Moiré gain based on pitches of the Moiré pattern.

2. The metrology system of claim 1, wherein the grating structure with the first pitch is detectable with the second optical configuration, wherein the overlay error along the measurement direction corresponds to a shift of the second layer with respect to the first layer, wherein the Moiré gain is $M_g = p_1/(p_1 - p_2)$.

3. The metrology system of claim 1, wherein the first image and the second image are generated sequentially.

4. The metrology system of claim 1, wherein the first image and the second image are generated simultaneously.

5. The metrology system of claim 1, further comprising:
- filtering the first measurement signal to isolate a Moiré fringe signal associated with a Moiré period of the first Moiré pattern prior to determining the first axis of symmetry; and
- filtering the second measurement signal to isolate a signal associated one of the grating structure with the first pitch or the grating structure with the second pitch prior to determining the second axis of symmetry.

6. The metrology system of claim 1, wherein the metrology target further includes one or more additional working zones with additional features having one or more pitches along an additional measurement direction, wherein the one or more processors are further configured to execute program instructions causing the one or more processors to calculate an overlay error along the additional measurement direction based on the additional features in the one or more additional working zones based on at least one of the first image or the second image.

* * * * *